(12) United States Patent
Chiu et al.

(10) Patent No.: US 12,021,021 B2
(45) Date of Patent: Jun. 25, 2024

(54) INTEGRATED CIRCUIT STRUCTURE

(71) Applicant: TAIWAN SEMICONDUCTOR MANUFACTURING COMPANY, LTD., Hsinchu (TW)

(72) Inventors: Te-Hsin Chiu, Miaoli County (TW); Shih-Wei Peng, Hsinchu (TW); Wei-Cheng Lin, Taichung (TW); Jiann-Tyng Tzeng, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 267 days.

(21) Appl. No.: 17/459,697

(22) Filed: Aug. 27, 2021

(65) Prior Publication Data
US 2023/0064223 A1    Mar. 2, 2023

(51) Int. Cl.
 *H01L 21/768* (2006.01)
 *H01L 23/522* (2006.01)
 *H01L 23/528* (2006.01)
 *H01L 27/02* (2006.01)
(52) U.S. Cl.
 CPC .... *H01L 23/5226* (2013.01); *H01L 21/76895* (2013.01); *H01L 23/528* (2013.01); *H01L 27/0207* (2013.01)

(58) Field of Classification Search
 CPC ......... H01L 21/76895; H01L 21/76897; H01L 21/823475; H01L 21/823871; H01L 23/5226; H01L 23/485
 See application file for complete search history.

(56) References Cited

U.S. PATENT DOCUMENTS

2018/0004883 A1* 1/2018 Yuan ..................... G06F 30/392
2019/0371891 A1* 12/2019 Goktepeli ......... H01L 21/76898
2020/0104445 A1* 4/2020 Peng ................. H01L 27/11807

* cited by examiner

*Primary Examiner* — Farun Lu
*Assistant Examiner* — Sandra Milena Rodriguez Villanueva
(74) *Attorney, Agent, or Firm* — Birch, Stewart, Kolasch & Birch, LLP

(57) ABSTRACT

An integrated circuit structure is disclosed, including a gate, a first conductive line and a pair of second conductive lines, and a first feed-through via. The gate is disposed on a front side of the integrated circuit structure and extends in a first direction on a first side of a dielectric layer. The first conductive line and a pair of second conductive lines are disposed on a second side, opposite of the first side, of the dielectric layer and on a back side, opposite of the front side, of the integrated circuit structure. The first conductive line is interposed between the pair of second conductive lines in a layout view. The first feed-through via extends through the dielectric layer in a second direction different from the first direction. The first feed-through via couples the gate to the first conductive line.

20 Claims, 31 Drawing Sheets

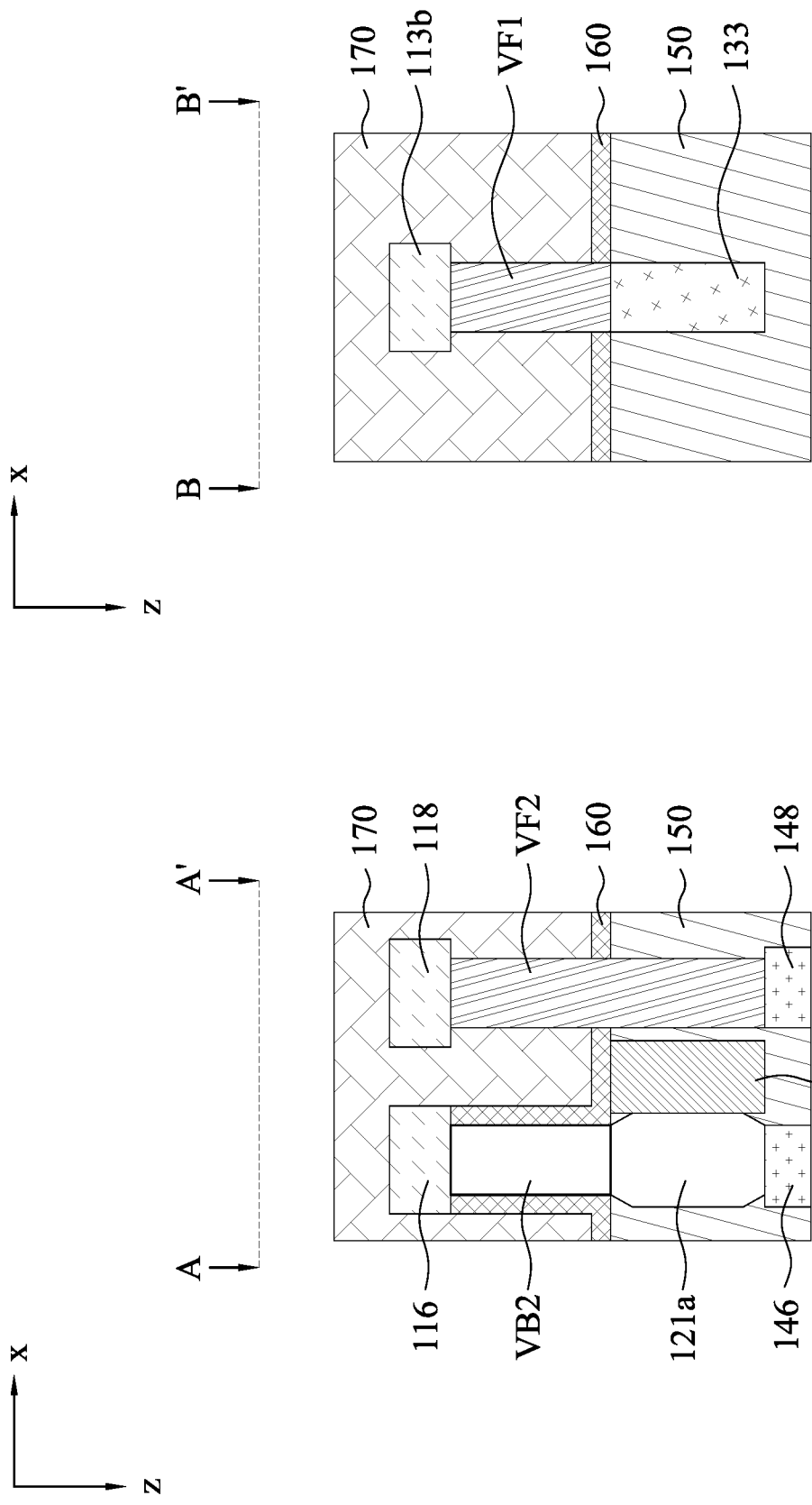

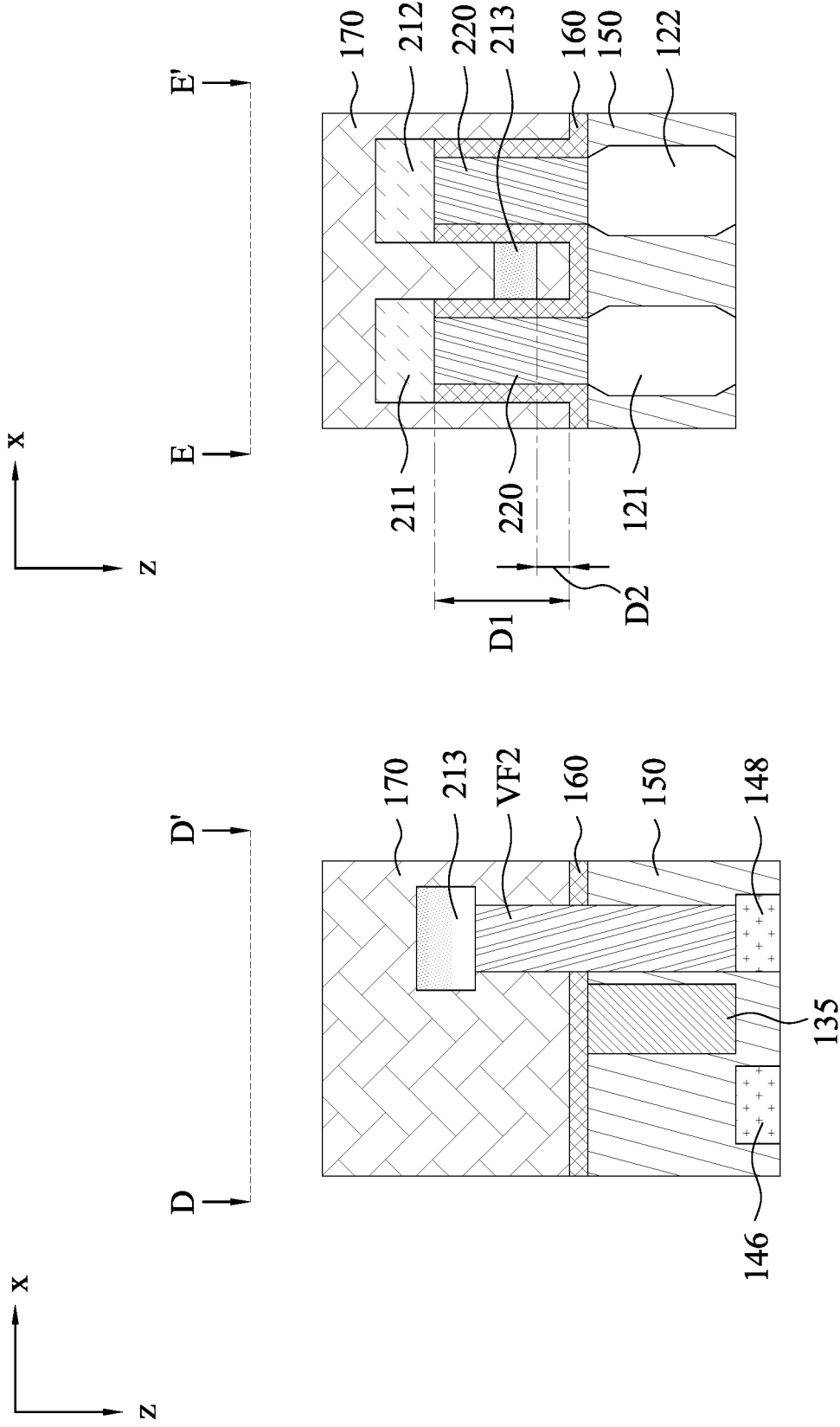

INTEGRATED CIRCUIT STRUCTURE

BACKGROUND

The semiconductor integrated circuit (IC) industry has experienced rapid growth. Technological advances in IC materials and design have produced generations of ICs. In some approaches, optimization of metal track arrangement is considered to reach higher area utilization.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1B is a cross-sectional view of part of the integrated circuit in FIG. 1A, taken along a line A-A' in FIG. 1A, in accordance with various embodiments.

FIG. 1C is a cross-sectional view of part of the integrated circuit in FIG. 1A, taken along a line B-B' in FIG. 1A, in accordance with various embodiments.

FIG. 2B is a cross-sectional view of part of the integrated circuit in FIG. 2A, taken along a line D-D' in FIG. 2A, in accordance with various embodiments.

FIG. 2C is a cross-sectional view of part of the integrated circuit in FIG. 2A, taken along a line E-E' in FIG. 2A, in accordance with various embodiments.

DETAILED DESCRIPTION

Figure 1A:
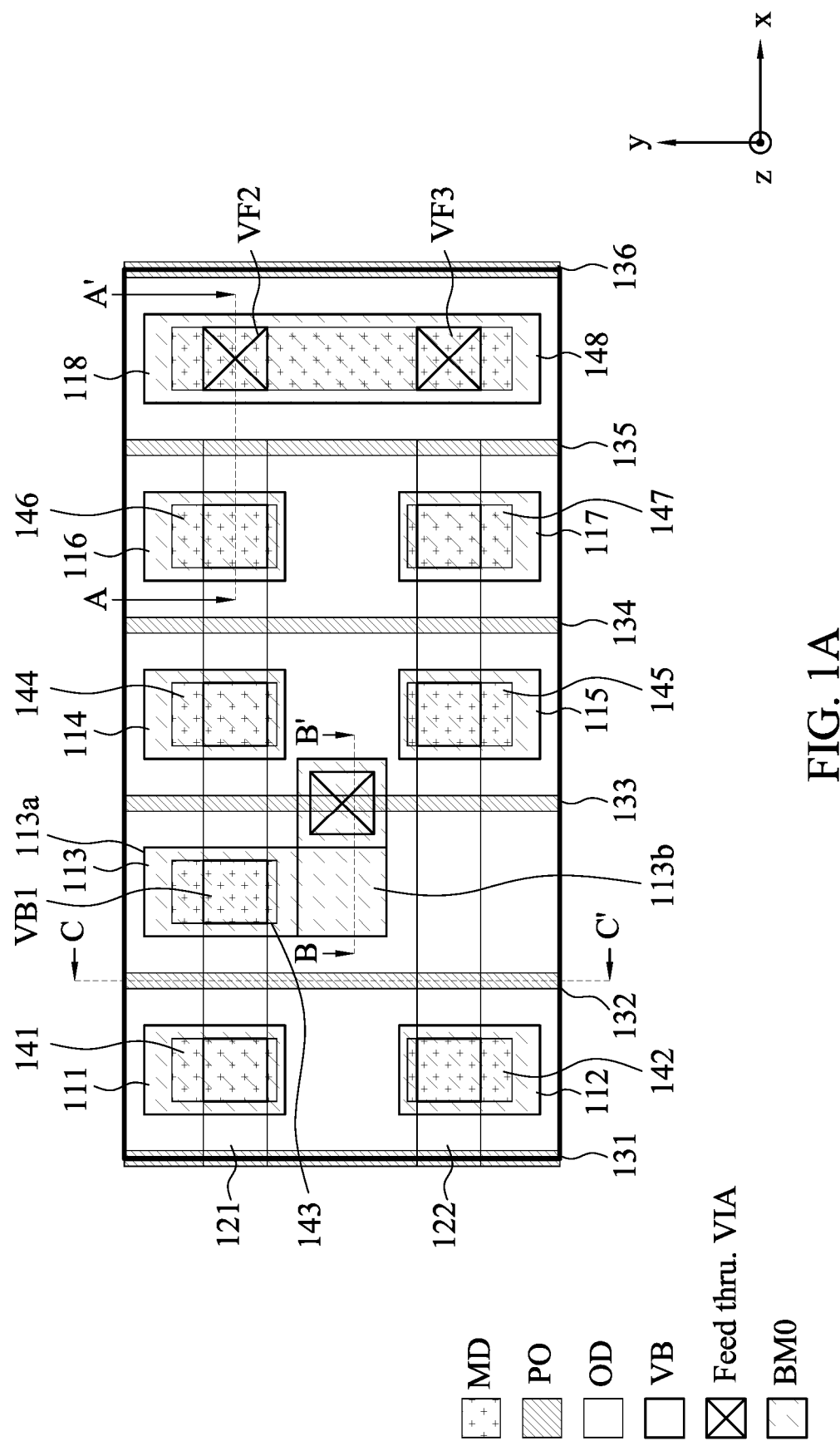
FIG. 1A is a layout diagram in a plan view of part of an integrated circuit, in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, the term "and/or" includes any and all combinations of one or more of the associated listed items.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

Reference is now made to FIG. 1A. FIG. 1A is a layout diagram in a plan view of part of an integrated circuit 100, in accordance with various embodiments. In some embodiments, the integrated circuit 100 is referred to as an integrated circuit structure including an active semiconductor device (i.e., with drain/source structure implements with active areas, gate structures, metal-on-device MD on the active areas, front side metal routing, etc.) on its front side and some metal routing on its backside. In some embodiments, the active semiconductor device on the front side of the integrated circuit 100 is formed on a substrate (not shown) in a front side process. After the front side process is complete, the integrated circuit 100 is flipped upside down, such that a backside surface of the substrate faces upwards. The substrate is further thinned down and removed. In some embodiments, thinning is accomplished by a CMP process, a grinding process, or the like. Accordingly, backside process is performed to form structures on the backside of the integrated circuit 100. The details of manufacturing process will be discussed later.

As shown in FIG. 1A, the integrated circuit 100 includes conductive lines (i.e., Back-side metal zero layer, BM0) 111-118, active areas (i.e., oxide-diffusion, OD) 121-122, gates 131-136, conductive segments 141-148 (i.e., metal on oxide-definition areas ("MOOD" or "MD"), and vias VB1-VB2, VF1-VF3. For the sake for brevity, similar structures are drawn as the same symbols in FIG. 1A. In some embodiments, the conductive lines 111-118 are on the backside of the integrated circuit 100. The active areas 121-122, the gates 131-136, and the conductive segments 141-148 are on the front side of the integrated circuit 100. In some embodiments, each of the vias VB1-VB2 (and other vias symbolized as structure VB) is disposed between the active area (i.e., the active area 121 or 122) and the conductive line (i.e., one of the conductive lines 111-118). Each of the vias VF1-VF3 is disposed between the conductive line (i.e., one of the conductive lines 111-118) and the conductive segment (i.e., one of the conductive segments 141-148).

For illustration, the conductive lines 111-118 extend in y direction and are separated from each other in x direction. The conductive lines 111-112 and 114-118 are interposed between the gates 131-136. In some embodiments, the conductive line 113 has a first portion 113a extending in y direction and a second portion 113b extending in x direction. As shown in FIG. 1A, the second portion 113b of the conductive line 113 overlaps the gate 133 in a layout view.

Furthermore, the active areas 121-122 extend in x direction and are separated from each other in y direction. In some embodiments, the active areas 121-122 are removed by a cut layer (not shown) between the gates 135-136. In some embodiments, the active area 121 is P-type and the active area 122 is N-type. The configurations of the active areas 121-122 are given for illustrative purposes. Various implements are within the contemplated scope of the present disclosure. For example, in some embodiments, the active areas 121-122 have some conductivity type. In various embodiments, the active area 121 is N-type and the active area 122 is P-type.

The gates 131-136 extend in y direction and are separated from each other in x direction. The gates 131-135 cross the active areas 121-122. In some embodiments, each of the gates 131-136 includes an interfacial layer (not shown) and a polysilicon (or poly) layer (not shown) over the interfacial layer. In some embodiments, each of the gates 131-136 further includes a gate dielectric layer (not shown) and a metal gate layer (not shown) disposed between the interfacial layer and the poly layer. In some embodiments, each of the gates 131-136 includes one or more metal layers in place of the poly layer. In various embodiments, the interfacial layer includes a dielectric material including, for example, silicon oxide ($SiO_2$) or silicon oxynitride (SiON), and is able to be formed by chemical oxidation, thermal oxidation, atomic layer deposition (ALD), chemical vapor deposition (CVD), and/or other suitable methods. In some embodiments, the polysilicon layer is formed by suitable deposition processes including, for example, low-pressure chemical vapor deposition (LPCVD) and plasma-enhanced CVD (PECVD). In some embodiments, the gate dielectric layer uses a high-k dielectric material including, for example, hafnium oxide ($HfO_2$), $Al_2O_3$, lanthanide oxides, TiO2, HfZrO, $Ta_2O_3$, $HfSiO_4$, $ZrO_2$, $ZrSiO_2$, combinations thereof, or other suitable material, and the gate dielectric layer is formed by ALD and/or other suitable methods. The metal gate layer includes a p-type work function metal or an n-type work function metal, and is deposited by CVD, PVD, and/or other suitable process. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The one or more metal layers use aluminum (Al), tungsten (W), copper (Cu), cobalt (Co), and/or other suitable materials; and are formed by CVD, PVD, plating, and/or other suitable processes. The formations and/or materials associated with the gates 131-136 are given for illustrative purposes. Various formations and/or materials associated with the gates 131-136 are within the contemplated scope of the present disclosure.

The conductive segments 141, 143, 144, and 146 are on and in contact with the active area 121. The conductive segments 142, 145, and 147 are on and in contact with the active area 122.

Reference is now made to FIG. 1B. FIG. 1B is a cross-sectional view of part of the integrated circuit 100 in FIG. 1A, taken along the line A-A' in FIG. 1A, in accordance with various embodiments. The integrated circuit 100 further includes dielectric layers 150-170. In some embodiments, the dielectric layer 150 is formed on the front side of the integrated circuit 100 in the front side process. The dielectric layers 160-170 are formed on the backside of the integrated circuit 100 in the backside process.

In some embodiments, the dielectric layers 150-170 include $SiO_2$, $Si_3N_4$, $SiO_xN_y$, SiC, SiCN films, SiOC, SiOCN films, and/or combinations thereof.

For illustration, an active region 121a of the active area 121, the gate 135, and the conductive segments 146, 148 are surrounded by a dielectric layer 150. A dielectric layer 160 is stacked between the dielectric layer 150 and a dielectric layer 170. The conductive lines 116 and 118 are surrounded by the dielectric layer 170.

The via VB2 extends in z direction and is coupled between the conductive line 116 and the active region 121a. The feed-through via VF2 extends in z direction through the dielectric layer 160 to couple the conductive line 118 to the conductive segment 148. Alternatively stated, the feed-through via VF2 extends from a first side of the dielectric layer 160 to a second side of the dielectric layer 160. To explain in another way, the active region 121a, the gate 135, and the conductive segments 146, 148 are on the first side of the dielectric layer 160, and the conductive lines 116 and 118 are on the second side, opposite of the first side, of the dielectric layer 160.

In some embodiments, a width of the feed-through via (i.e., the feed-through via VF2) along x direction and/or y direction is about 10 to about 40 nm. A depth of the feed-through via (i.e., the feed-through via VF2) along z direction is about 20 nm to about 150 nm.

Reference is now made to FIG. 1C. FIG. 1C is a cross-sectional view of part of the integrated circuit 100 in FIG. 1A, taken along the line B-B' in FIG. 1A, in accordance with various embodiments. For illustration, the feed-through via VF1 extends through the dielectric layer 160 in z direction. The feed-through via VF1 is coupled between a metal gate layer of the gate 133 and the second portion 113b of the conductive line 113. With reference to FIGS. 1A-1B, the gate 133 is further coupled to the active area 121 through the feed-through via VF1, the second portion 113b of the conductive line 113, the first portion 113a of the conductive line 113, and the via VB1.

Figure 1D:
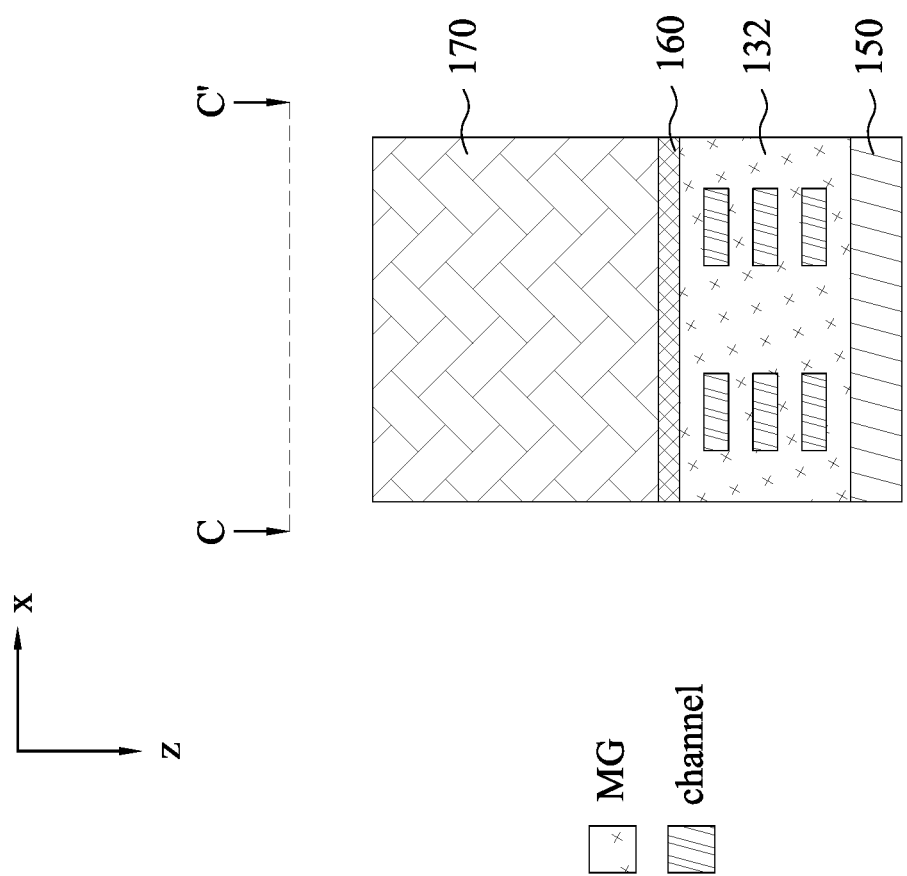
FIG. 1D is a cross-sectional view of part of the integrated circuit in FIG. 1A, taken along a line C-C' in FIG. 1A, in accordance with various embodiments.

Reference is now made to FIG. 1D. FIG. 1D is a cross-sectional view of part of the integrated circuit 100 in FIG. 1A, taken along the line C-C' in FIG. 1A, in accordance with various embodiments. For illustration, a metal gate layer of the gate 132 surrounds channel regions. In some embodiments, the channel regions are implemented by structure, such like nanosheet. The term nanosheet is used herein to designate any material portion with nano scale, or even micro scale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. In various embodiments, the channel region includes materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof.

The configurations of FIGS. 1A-1D are given for illustrative purposes. Various implements are within the contemplated scope of the present disclosure. For example, in some embodiments, one of the feed-through vias VF2-VF3 is omitted. In various embodiments, the conductive line 118, the conductive segment 148, and the feed-through vias VF2-VF3 are not included.

Figure 2A:
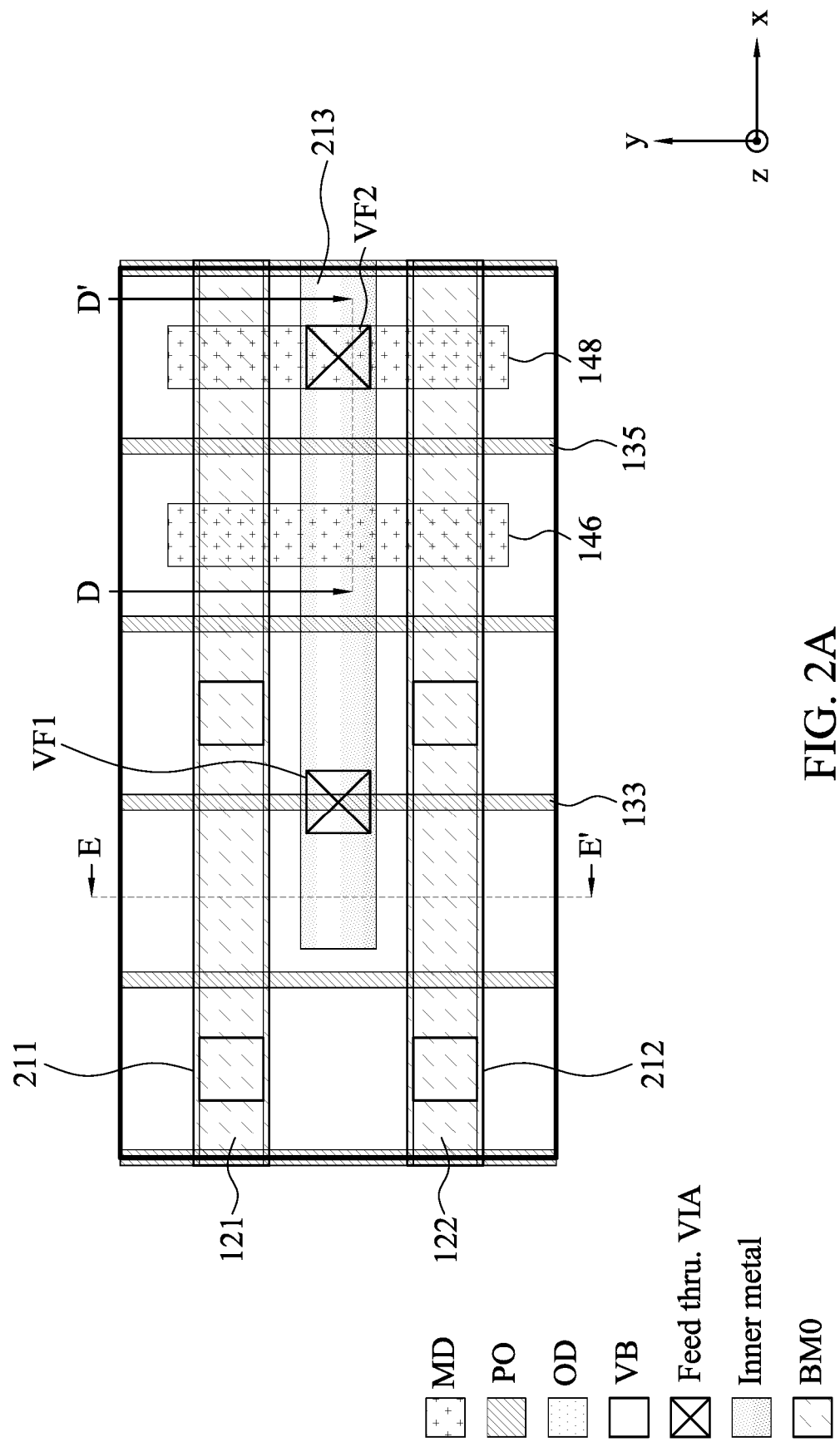
FIG. 2A is a layout diagram in a plan view of part of an integrated circuit, in accordance with various embodiments.

Reference is now made to FIG. 2A. FIG. 2A is a layout diagram in a plan view of part of an integrated circuit 200, in accordance with various embodiments. With respect to the embodiments of FIGS. 1A-1D, like elements in FIGS. 2A-2C are designated with the same reference numbers for ease of understanding. The specific operations of similar elements, which are already discussed in detail in above paragraphs, are omitted herein for the sake of brevity, unless there is a need to introduce the co-operation relationship with the elements shown in FIGS. 2A-2C. For the sake of simplicity, the conductive segments 141-142 and 144-145 are not shown in FIG. 2A.

Compared with FIG. 1A, instead of having conductive lines extending in y direction on the backside, the integrated circuit 200 includes conductive lines 211-213 which extend in x direction and are separated from each other in y direction. As shown in FIG. 2A, the conductive lines 211-212 overlap the active areas 121-122 respectively. In some embodiments, the conductive lines 211-212 are configured with respect to, for example, the conductive lines 111-118 in FIG. 1A.

As shown in FIG. 2A, the conductive line 213 is interposed between the conductive lines 211-212. In the layout view, the gates 133-135 cross the conductive line 213, and the conductive line 213 overlaps the feed-through vias VF1-VF2, in which feed-through via VF2 is disposed between the conductive lines 211-212.

For illustration, the conductive segment 146 extends in y direction. In the layout view, the conductive segments 146 and 148 overlap the conductive lines 211-213, and the conductive segment 148 further overlaps the feed-through via VF2.

Reference is now made to FIG. 2B. FIG. 2B is a cross-sectional view of part of the integrated circuit 200 in FIG. 2A, taken along the line D-D' in FIG. 2A, in accordance with various embodiments. For illustration, the feed-through via VF2 extends through the dielectric layer 160 and is apart from the gate 135. The feed-through via VF2 couples the conductive line 213 to the conductive segment 148.

Reference is now made to FIG. 2C. FIG. 2C is a cross-sectional view of part of the integrated circuit 200 in FIG. 2A, taken along the line E-E' in FIG. 2A, in accordance with various embodiments. For illustration, the integrated circuit 200 includes dielectric layers 220 between the conductive lines 211-212 and the active areas 121-122. Accordingly, the conductive lines 211-212 are isolated from the active areas 121-122.

In some embodiments, the dielectric layer 220 includes $SiO_2$, $Si_3N_4$, $SiO_xN_y$, SiC, SiCN films, SiOC, SiOCN films, and/or combinations thereof.

As shown in FIG. 2C, the conductive line 211 is a distance D1 away from the dielectric layer 160. The conductive line 213 is a distance D2 away from the dielectric layer 160. In some embodiments, the distances D1-D2 are the same. In another embodiment, the distance D2 is smaller than the distance D1. In still another embodiment, the distance D1 is about 20 nm, and the distance D2 is about 10 nm. In still another embodiment, the distance D2 is in a range of about 10-20 nm. The conductive line 213 is referred to as an inner metal layer, in which the term "inner metal" corresponds to metal layers disposed closer to the active semiconductor device on the front side, compared with backside metal zero (BM0) layer on the backside.

In some embodiments, the conductive lines 211-212 are configured to transmit power signals (i.e., supply voltages VDD (high voltage level) and VSS (low voltage level).) The conductive line 213 is configured to transmit a (control) signal from/to the gate 133 to/from the conductive segment 148. In some embodiments, the active semiconductor device including the conductive segment 148 operates based on the signal received/transmitted by the conductive segment 148. Alternatively stated, the conductive line(s) on the backside of the integrated circuit 200 is further configured to transmit signals for logic operation, in addition to transmitting the power signal.

According to some approaches, metal layers on the backside of an integrated circuit structure are configured to transmit power signals only. In such approaches, metal layers are implemented by the backside metal zero (BM0) layers. In contrast, with the configurations of the present disclosure, the inner metal layer(s) is implemented in the backside metal routing for transmitting signals (i.e., logic signal(s).) Furthermore, because the inner metal layer(s) is arranged in a metal track(s) which is not utilized in some approaches and between the backside metal zero layer and the active semiconductor device, the backside metal resource of the integrated circuit in the present disclosure is optimized.

The configurations of FIG. 2A-2C are given for illustrative purposes. Various implements are within the contemplated scope of the present disclosure. For example, in some embodiments, the width of the conductive line 213 in y direction is reduced and the distance D1 equals to the distance D2. Alternatively stated, the conductive lines 211-213 are in the same layer on the backside of the integrated circuit 200.

Figure 3A:
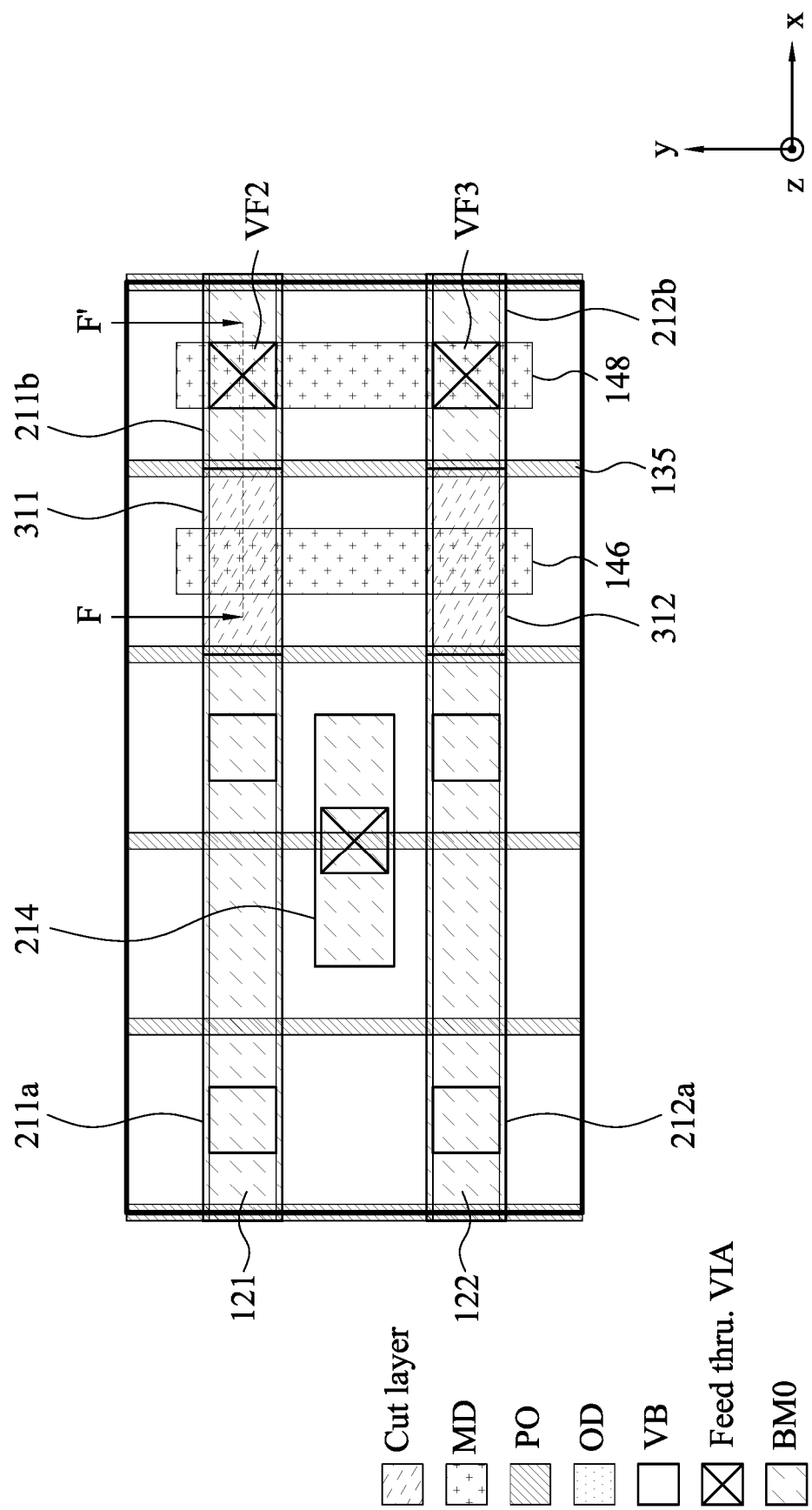
FIG. 3A is a layout diagram in a plan view of part of an integrated circuit, in accordance with various embodiments.
Figure 3B:
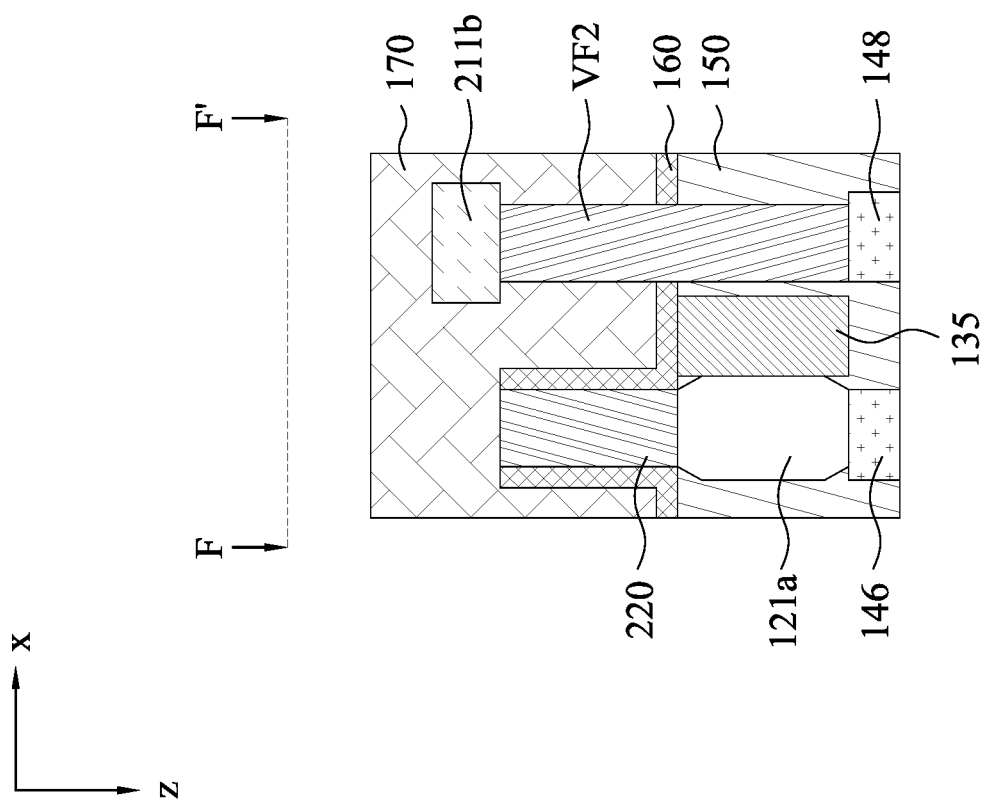
FIG. 3B is a cross-sectional view of part of the integrated circuit in FIG. 3A, taken along a line F-F' in FIG. 3A, in accordance with various embodiments.

Reference is now made to FIG. 3A. FIG. 3A is a layout diagram in a plan view of part of an integrated circuit 300, in accordance with various embodiments. With respect to the embodiments of FIGS. 1A-2C, like elements in FIGS. 3A-3B are designated with the same reference numbers for ease of understanding.

Compared with FIG. 2A, the integrated circuit 300 includes cut layers 311 and 312 applied to the conductive lines 211-212 of FIG. 2A respectively. For illustration, the cut layers 311-312 have a gate pitch (distance between two adjacent gate structures.) The conductive lines 211a-211b are separated by the cut layer 311, and the conductive lines 212a-212b are separated by the cut layer 312.

Instead of having the conductive line 213, the integrated circuit 300 includes the conductive line 214 coupled to the feed-through via VF1. In some embodiments, the conductive line 214 is configured with respect to, for example, the conductive line 211.

For illustration, the active areas 121-122 are cut and absent between the gates 135-136. The conductive lines 211b and 212b extend in x direction and overlap the feed-through vias VF2 and VF3 respectively.

Reference is now made to FIG. 3B. FIG. 3B is a cross-sectional view of part of the integrated circuit 300 in FIG. 3A, taken along the line F-F' in FIG. 3A, in accordance with various embodiments. For illustration, the dielectric layer 220 surrounded by the dielectric layer 160 is mounted on the active region 121a. The feed-through via VF2 is coupled between the conductive line 211b to the conductive segment 148.

In some embodiments, with the separated conductive lines 211a-211b, different signals are transmitted for the devices including the conductive line 211a and including the conductive line 211b. Accordingly, flexibility for metal routing and operations is provided.

The configurations of FIGS. 3A-3B are given for illustrative purposes. Various implements are within the contemplated scope of the present disclosure. For example, in some embodiments, the active areas 121-122 are cut by cut layers (not shown) and absent between the gates 134-135.

Figure 4A:
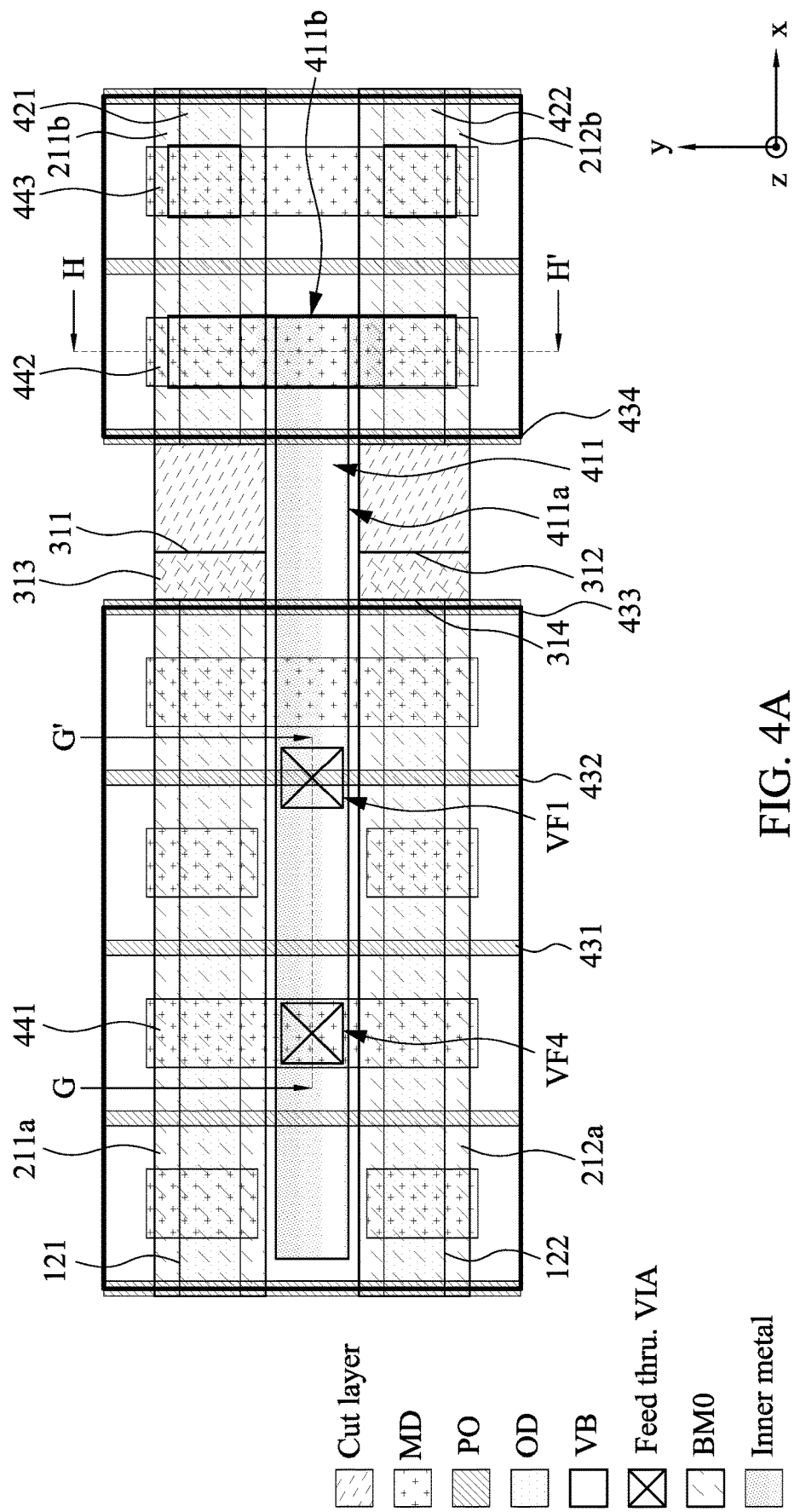
FIG. 4A is a layout diagram in a plan view of part of an integrated circuit, in accordance with various embodiments.
Figures 4B, 4C:
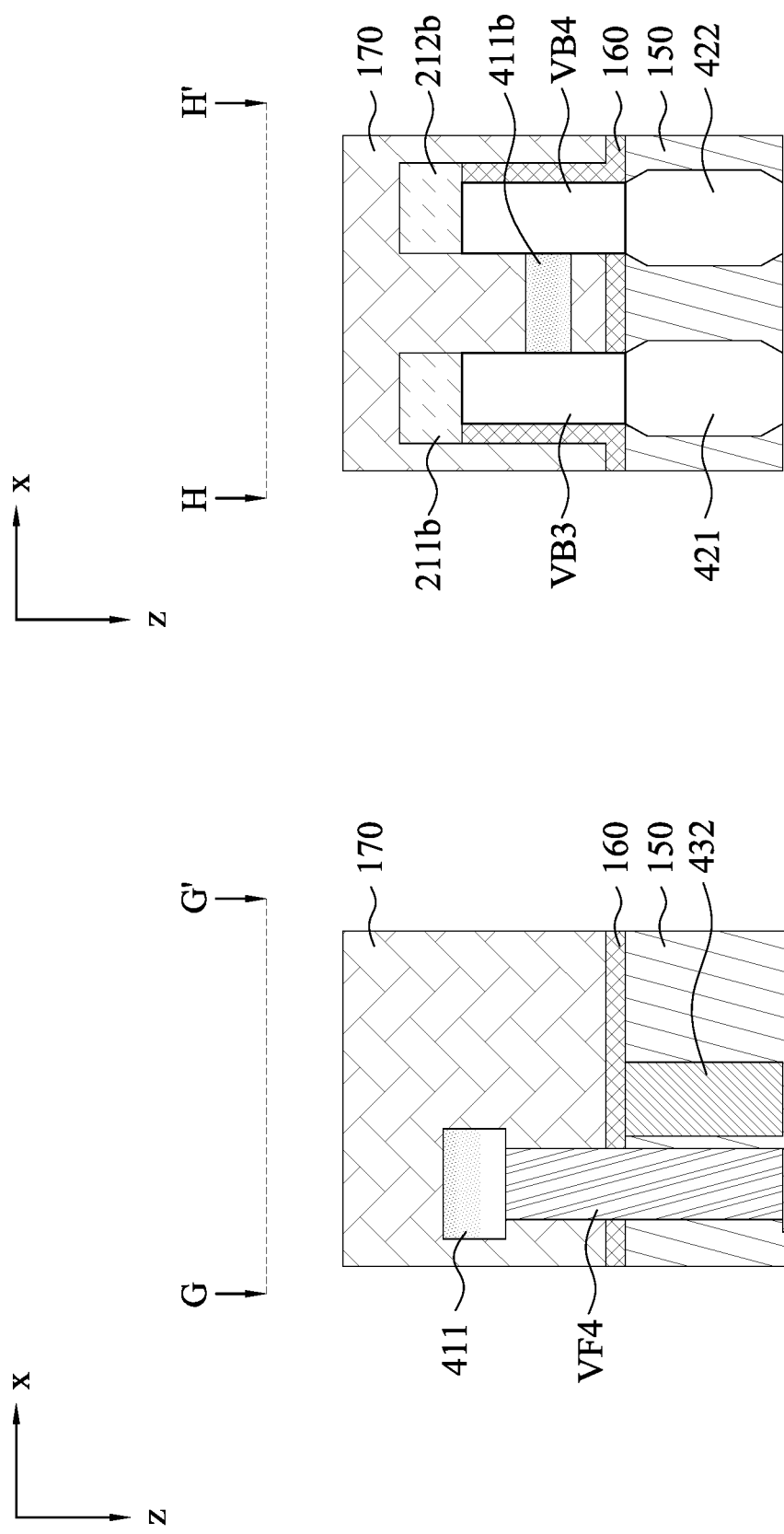
FIG. 4B is a cross-sectional view of part of the integrated circuit in FIG. 4A, taken along a line G-G' in FIG. 4A, in accordance with various embodiments.
FIG. 4C is a cross-sectional view of part of the integrated circuit in FIG. 4A, taken along a line H-H' in FIG. 4A, in accordance with various embodiments.

Reference is now made to FIG. 4A. FIG. 4A is a layout diagram in a plan view of part of an integrated circuit 400, in accordance with various embodiments. With respect to the embodiments of FIGS. 1A-3B, like elements in FIGS. 4A-4C are designated with the same reference numbers for ease of understanding.

Compared with FIG. 3A, the integrated circuit 400 includes a cut layer 313 to separate the active area 121 from an active area 421 and a cut layer 314 to separate the active area 122 from an active area 422. In some embodiments, the cut layers 311-312 are portions of a first cut layer and the cut layers 313-314 are portions of a second cut layer. The first cut layer or/and the second cut layer is configured to separate a cell including the conductive lines 211a, 212a and the active areas 121-122 from another cell including the conductive lines 211b, 212b and the active areas 421-422.

In some embodiments, the active areas 121 and 421 have the same conductivity type. The active areas 122 and 422 have the same conductivity type. In various embodiments, the active areas 421-422 have the same conductivity type.

The integrated circuit 400 includes several gate structure and conductive segments extending in y direction. In some embodiments, the integrated circuit 400 includes gates 431-434 and conductive segments 441-443. The gates 431-434 are configured with respect to, for example, the gate 133. The conductive segments 441-443 are configured with respect to, for example, the conductive segment 148.

For illustration, the gates 431-434 and the conductive segments 441-443 extend in y direction. The conductive segments are interposed between the gates. In the layout view, the gates 431-433 and the conductive segment 441 cross the active areas 121-122. The gate 434 and the conductive segments 442-443 cross the active areas 421-422.

The integrated circuit 400 further includes a conductive line 411 interposed between the conductive lines 211a and 212a and between the conductive line 211b and 212b. In some embodiments, the conductive line 411 is configured with respect to, for example, the conductive line 213. For illustration, the conductive line 411 includes a first portion 411a extending in x direction and a second portion 411b extending in y direction between the vias VB3-VB4. The conductive line 411 is coupled to the gate 432 by the feed-through via VF1.

The vias VB3-VB4 are configured with respect to, for example, the VB2. The feed-through via VF4 is configured with respect to, for example, the feed-through via VF1. In the layout view, the vias VB3-VB4 overlap with the conductive segment 442. The via VB3 overlaps the conductive line 211b and the active area 421. The via VB4 overlaps the conductive line 212b and the active area 422. The feed-through via VF4 overlaps the conductive line 411 and the conductive segment 441.

Reference is now made to FIG. 4B. FIG. 4B is a cross-sectional view of part of the integrated circuit 400 in FIG. 4A, taken along the line G-G' in FIG. 4A, in accordance with various embodiments. For illustration, the feed-through via VF4 extends from the first side of the dielectric layer 160 to the second side of the dielectric layer 160 to couple the conductive line 411 (i.e., the first portion 411a of the conductive line 411) to the conductive segment 441.

Reference is now made to FIG. 4C. FIG. 4C is a cross-sectional view of part of the integrated circuit 400 in FIG. 4A, taken along the line H-H' in FIG. 4A, in accordance with various embodiments. For illustration, the via VB3 is coupled between the conductive line 211b and the active area 421. The via VB4 is coupled between the conductive line 212b and the active area 422. In addition, the conductive line 411b is further coupled to the vias VB3 and VB4 at exposed surfaces thereof, as shown in FIG. 4C.

The configurations of FIGS. 4A-4C are given for illustrative purposes. Various implements are within the contemplated scope of the present disclosure. For example, in some embodiments, the cut layers 311-314 have the same dimension.

Figure 5A:
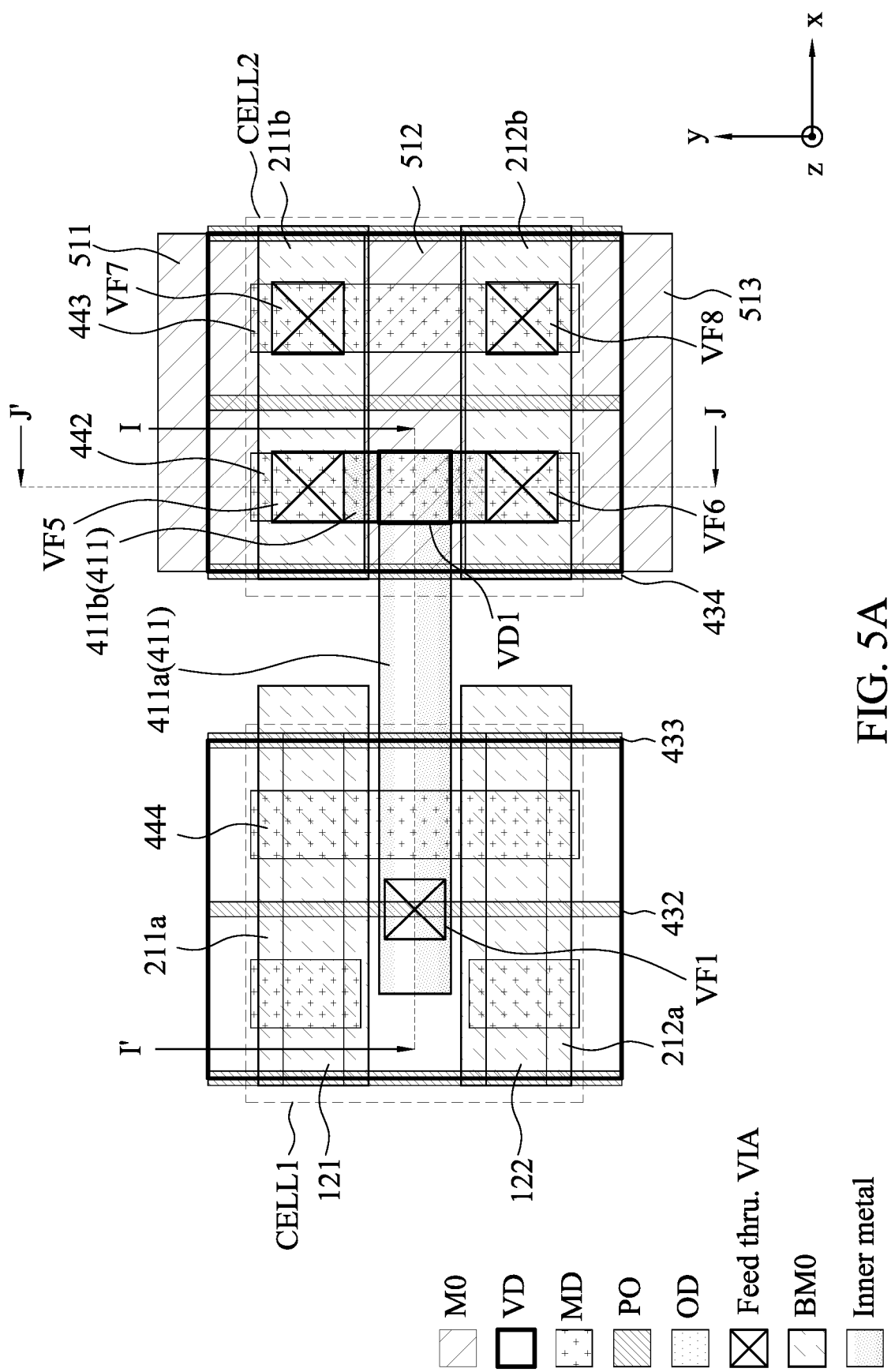
FIG. 5A is a layout diagram in a plan view of part of an integrated circuit, in accordance with various embodiments.
Figure 5B:
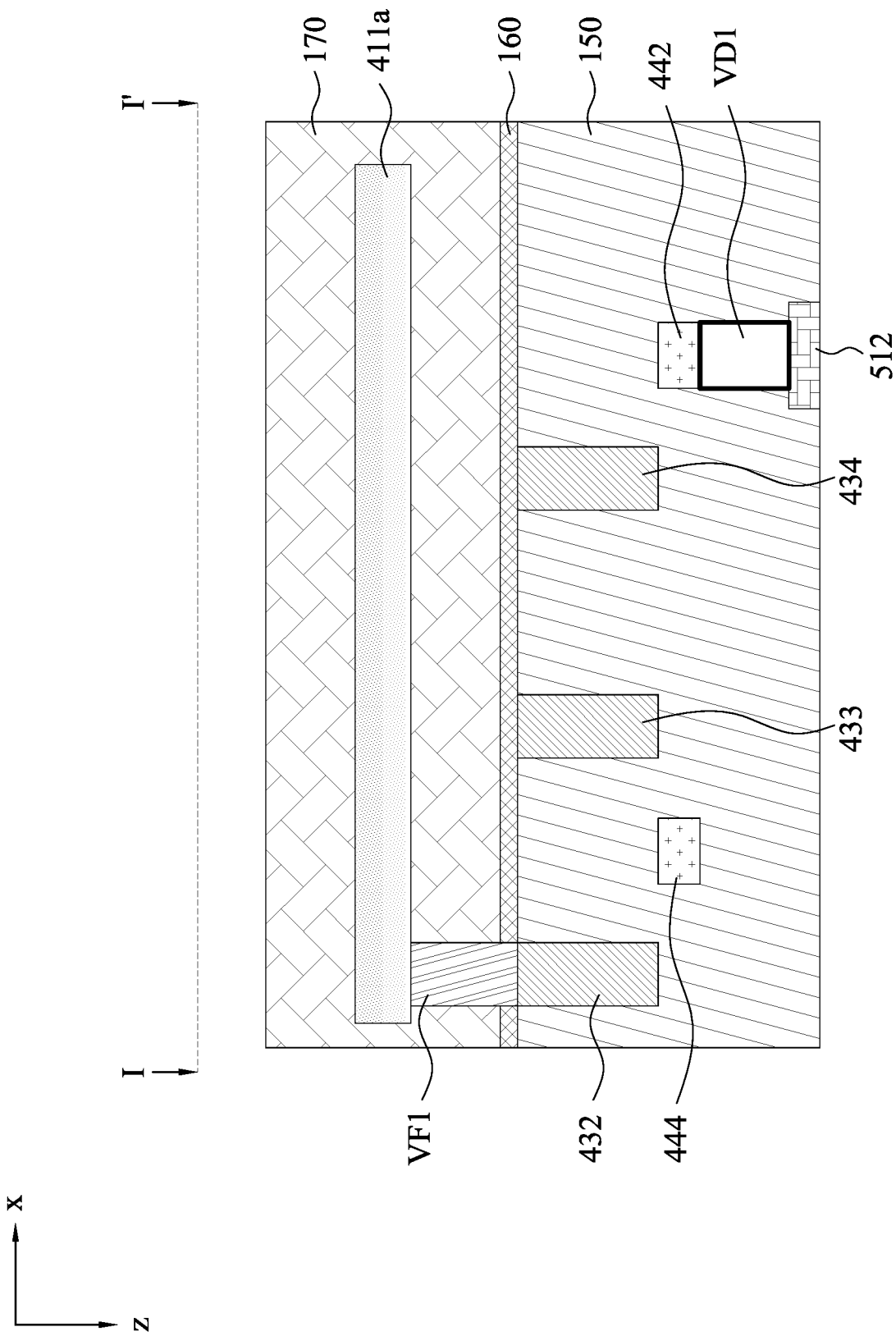
FIG. 5B is a cross-sectional view of part of the integrated circuit in FIG. 5A, taken along a line I-I' in FIG. 5A, in accordance with various embodiments.
Figure 5C:
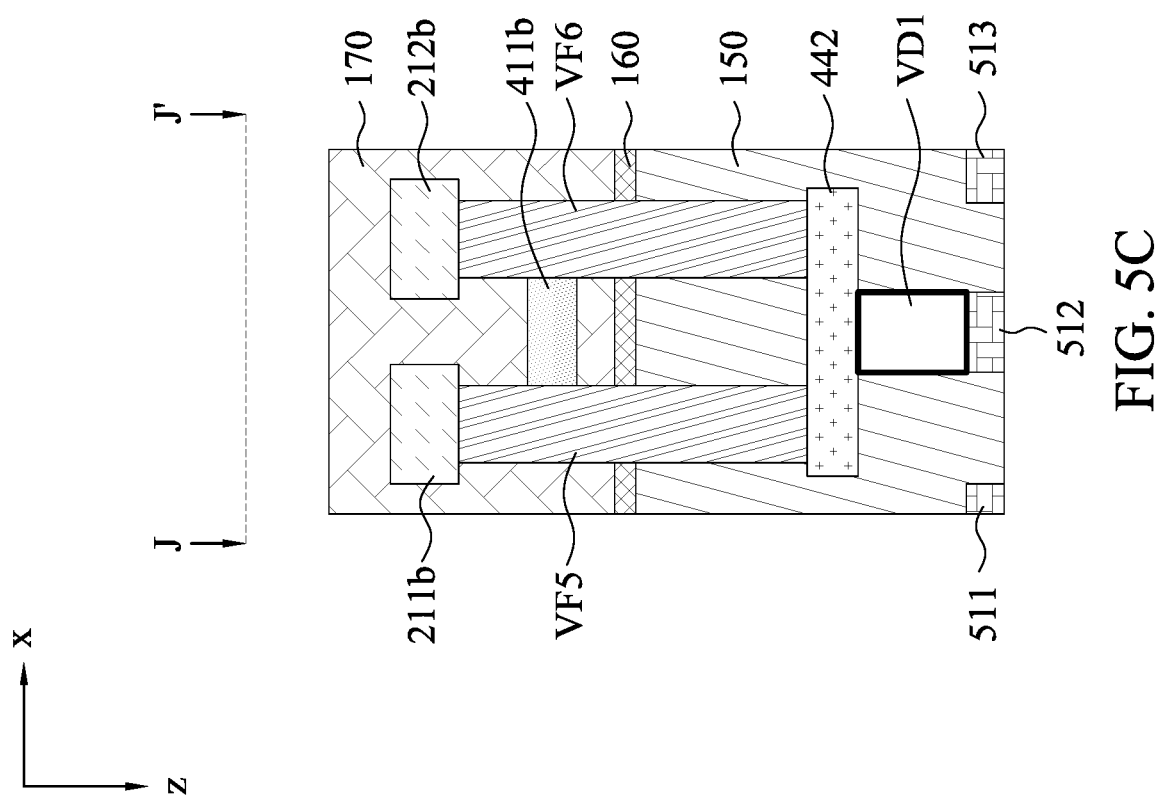
FIG. 5C is a cross-sectional view of part of the integrated circuit in FIG. 5A, taken along a line J-J' in FIG. 5A, in accordance with various embodiments.

Reference is now made to FIG. 5A. FIG. 5A is a layout diagram in a plan view of part of an integrated circuit 500, in accordance with various embodiments. With respect to the embodiments of FIGS. 1A-4C, like elements in FIGS. 5A-5C are designated with the same reference numbers for ease of understanding.

The integrated circuit 500 includes cells CELL1-CELL2 encompassing elements as shown in FIG. 5A. The integrated circuit 500 further includes conductive tracks (i.e., metal zero, M0) 511-513 that extend in x direction on the front side of the integrated circuit 500 and are separated from each other in y direction. In some embodiments, the conductive tracks 511-513 are in a layer above the conductive segment at the front side.

Compared with FIG. 4A, instead of having the vias VB3-VB4 and other via overlapping the active areas 421-422, the integrated circuit 500 includes feed-through vias VF5-VF8. As shown in FIG. 5A, in the layout view, the feed-through vias VF5 and VF6 overlap the conductive lines 211b and 212b respectively. The feed-through vias VF7 and VF8 overlap the conductive lines 211b and 212b respectively. The feed-through vias VF5-VF6 overlap the conductive segment 442, and the feed-through vias VF7-VF8 overlap the conductive segment 443.

The integrated circuit 500 further includes a via VD1 between the feed-through vias VF5-VF6. In the layout view, the via VD1 overlaps the second portion 411b of the conductive line 411, the conductive segment 442, and the conductive track 512.

Reference is now made to FIG. 5B. FIG. 5B is a cross-sectional view of part of the integrated circuit 500 in FIG. 5A, taken along the line I-I' in FIG. 5A, in accordance with various embodiments. For illustration, the first portion 411a of the conductive line 411 is coupled to the gate 432 through the feed-through via VF1. The conductive segment 442 is coupled to the conductive track 512 through the via VD1.

Reference is now made to FIG. 5C. FIG. 5C is a cross-sectional view of part of the integrated circuit 500 in FIG. 5A, taken along the line J-J' in FIG. 5A, in accordance with various embodiments. For illustration, the feed-through vias VF5-VF6 extend through the dielectric layer 160. The feed-through via VF5 couples the conductive line 211b to the conductive segment 442. Similarly, the feed-through via VF6 couples the conductive line 212b to the conductive segment 442. The conductive segment 442 is further coupled to the conductive track 512 through the via VD1. In addition, the second portion 411b of the conductive line 411 is coupled to both of the feed-through vias VF5-VF6.

With reference to FIGS. 5A-5C, in some embodiments, the gate 432 is configured as a terminal of the cell CELL1, and the conductive segment 442 is configured a terminal of the cell CELL2. Accordingly, a signal is transmitted between the cells CELL1-CELL2 through the conductive line 411 coupled to the gate 432 and the conductive segment 442. In addition, the conductive tracks 511-513 are further coupled to other devices on the front side of the integrated circuit 500. Alternatively stated, the cell CELL2 is referred to as a feed-through cell to transmit a backside signal generated in the cell CELL1 to the devices on the front side of the integrated circuit 500.

The configurations of FIGS. 5A-5C are given for illustrative purposes. Various implements are within the contemplated scope of the present disclosure. For example, in some embodiments, the cell CELL2 includes three gate pitches (between four gates).

Figure 6A:
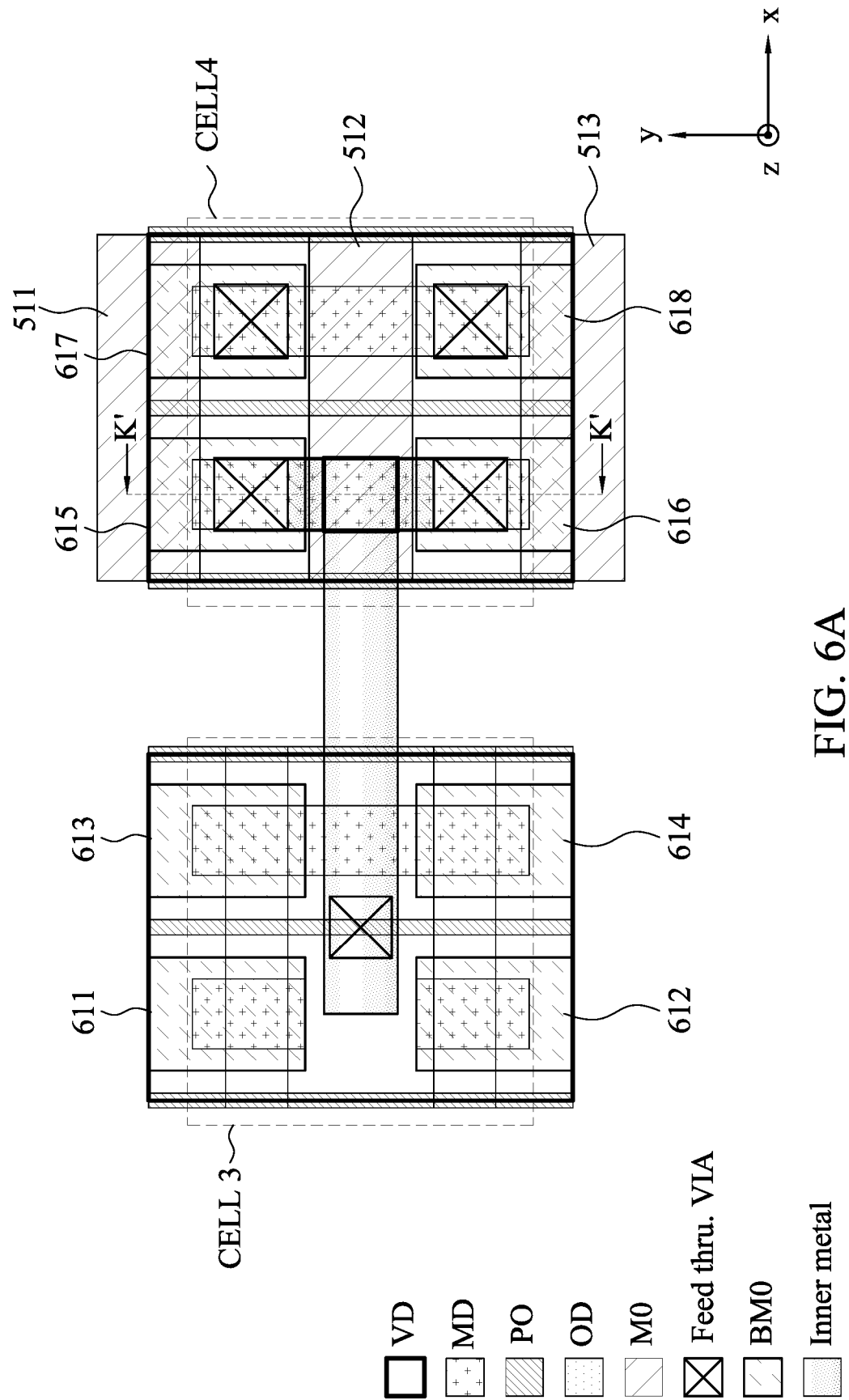
FIG. 6A is a layout diagram in a plan view of part of an integrated circuit, in accordance with various embodiments.

Reference is now made to FIG. 6A. FIG. 6A is a layout diagram in a plan view of part of an integrated circuit 600, in accordance with various embodiments. With respect to the embodiments of FIGS. 1A-5C, like elements in FIGS. 6A-6B are designated with the same reference numbers for ease of understanding.

Compared with FIG. 5A, instead of having the conductive lines 211a-211b and 212a-212b extending in x direction, the integrated circuit 600 includes conductive lines 611-614 in a cell CELL3 and conductive lines 615-618 in a cell CELL4. In some embodiments, the conductive lines 611-618 are configured with respect to, for example, the conductive line 111 in FIG. 1A. For illustration, the conductive lines 611-618 extend in y direction and are separated from each other in x direction. The conductive track 511 overlaps the conductive lines 615 and 617, and the conductive track 513 overlaps the conductive lines 616 and 618, in a layout view.

Figure 6B:
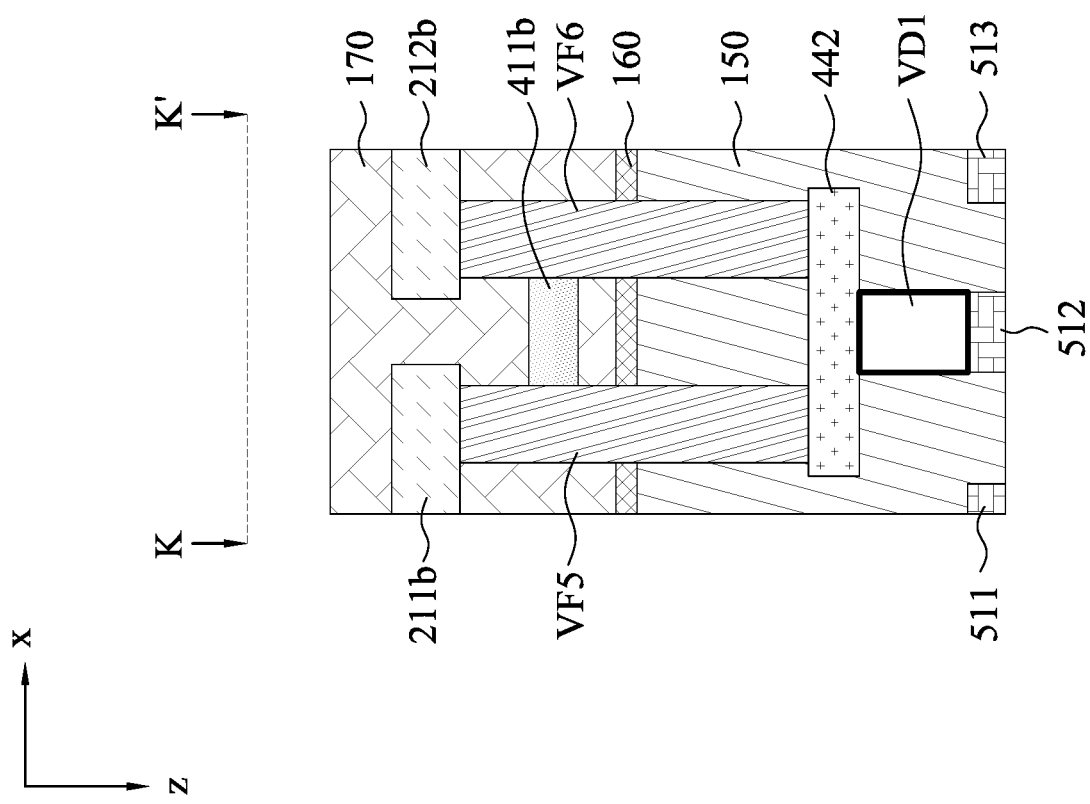
FIG. 6B is a cross-sectional view of part of the integrated circuit in FIG. 6A, taken along a line K-K' in FIG. 6A, in accordance with various embodiments.

Reference is now made to FIG. 6B. FIG. 6B is a cross-sectional view of part of the integrated circuit 600 in FIG. 6A, taken along the line K-K' in FIG. 6A, in accordance with various embodiments. Compared with FIG. 5C, the conductive line 211b further extends farther. Similarly, the conductive line 212b further extends farther than the 212b in FIG. 5C.

The configurations of FIGS. 6A-6B are given for illustrative purposes. Various implements are within the contemplated scope of the present disclosure. For example, in some embodiments, the second portion 411b of the conductive line 411 merely extends to the feed-through via VF5 and is not coupled to the feed-through via VF6.

Figure 7A:
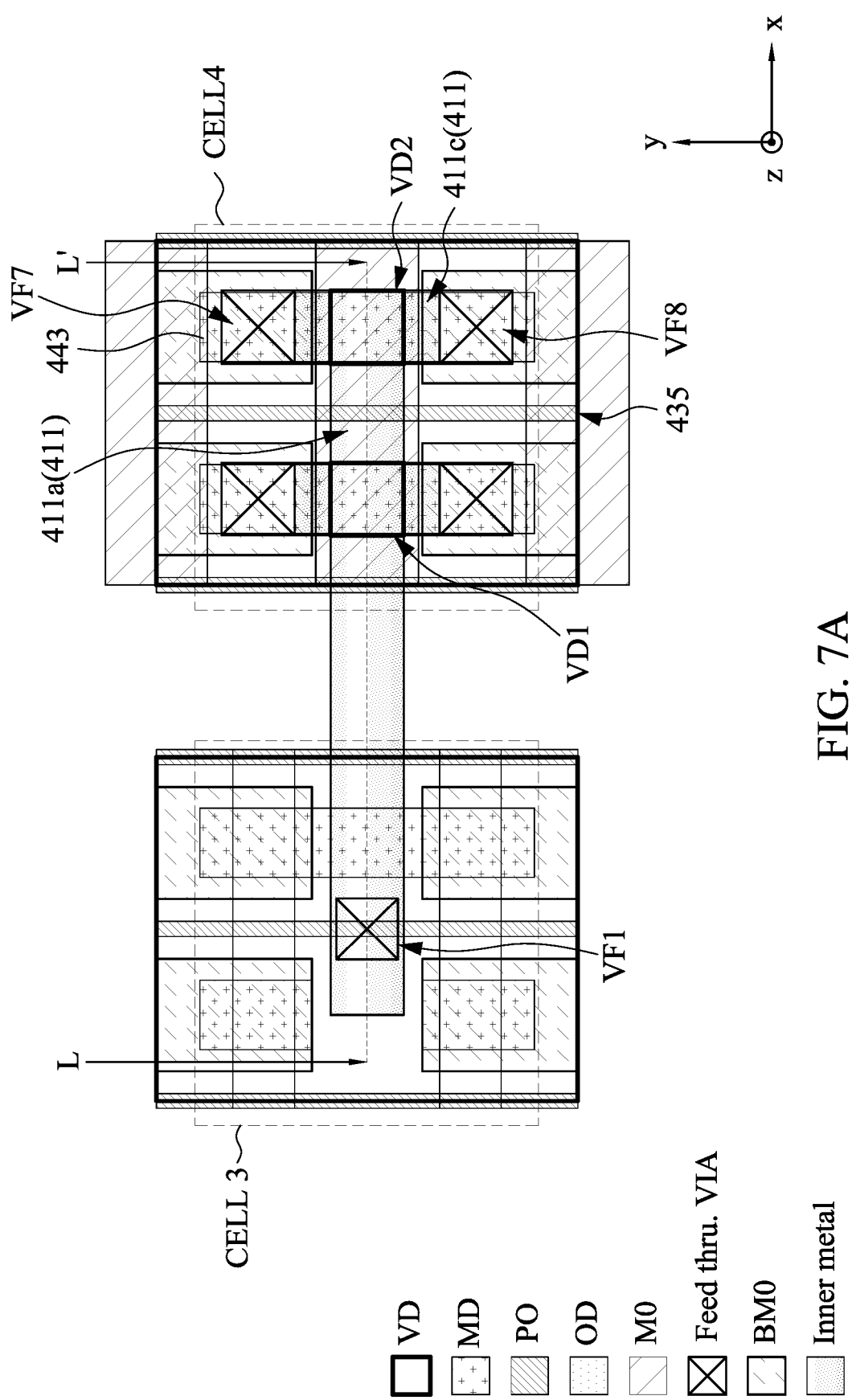
FIG. 7A is a layout diagram in a plan view of part of an integrated circuit, in accordance with various embodiments.

Reference is now made to FIG. 7A. FIG. 7A is a layout diagram in a plan view of part of an integrated circuit 700, in accordance with various embodiments. With respect to the embodiments of FIGS. 1A-6B, like elements in FIGS. 7A-7B are designated with the same reference numbers for ease of understanding.

Compared with FIG. 6A, the conductive line 411 further includes a third portion 411c extending in y direction between the feed-through vias VF7-VF8. In addition, the first portion 411a of the conductive line 411 further extends in x direction to cross the gate 435 in the layout view.

The integrated circuit 700 further includes a via VD2 between the feed-through vias VF7-VF8. In some embodiments, the via VD2 is configured with respect to, for example, the via VD1. In the layout view, the conductive segment 443 overlaps the via VD2.

Figure 7B:
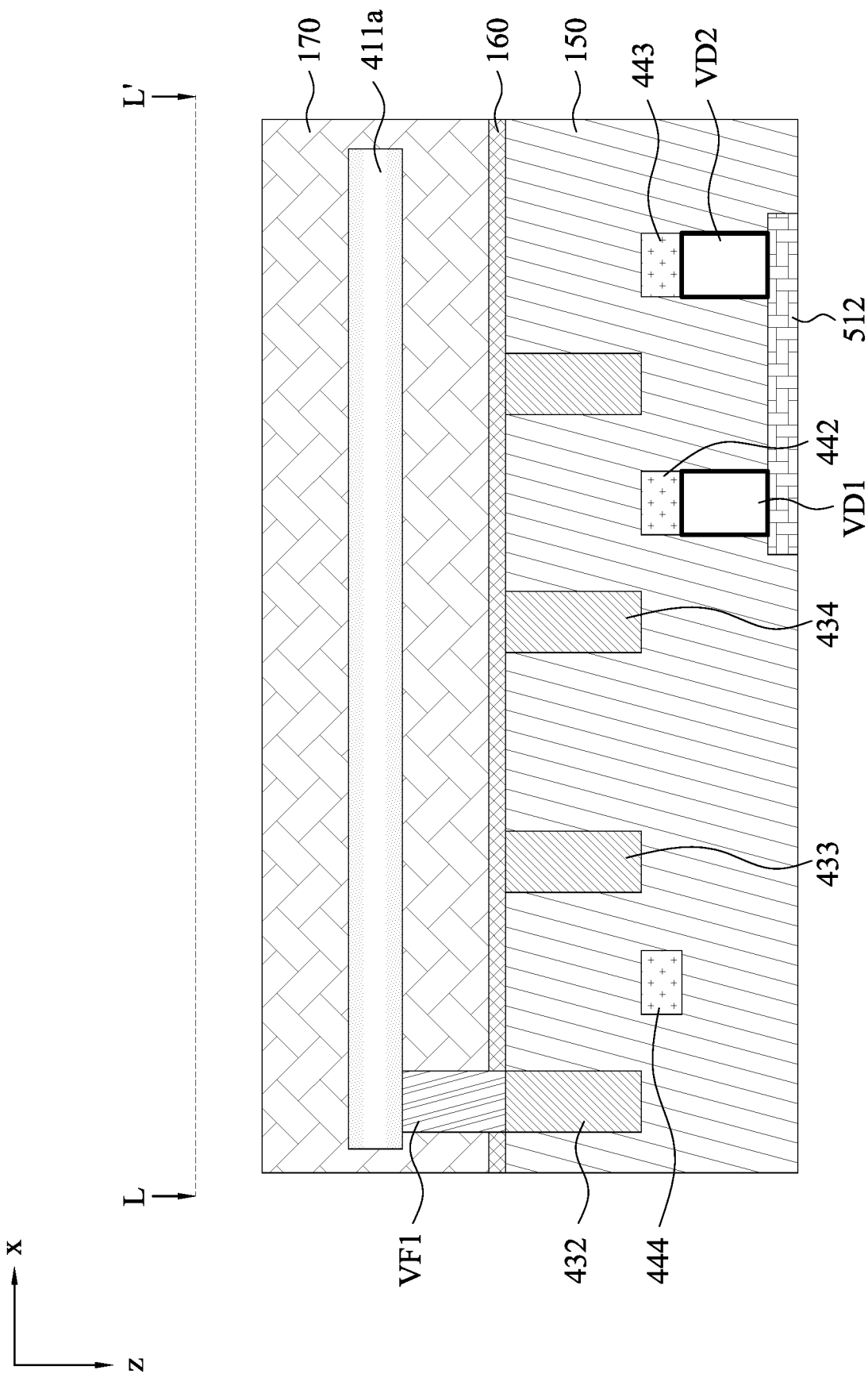
FIG. 7B is a cross-sectional view of part of the integrated circuit in FIG. 7A, taken along a line L-L' in FIG. 7A, in accordance with various embodiments.

Reference is now made to FIG. 7B. FIG. 7B is a cross-sectional view of part of the integrated circuit 700 in FIG. 7A, taken along the line L-L' in FIG. 7A, in accordance with various embodiments. For illustration, the conductive track 512 is further coupled to the conductive segment 443 through the via VD2.

The configurations of FIGS. 7A-7B are given for illustrative purposes. Various implements are within the contemplated scope of the present disclosure. For example, in some embodiments, instead of having conductive lines extending in y direction, the integrated circuit 700 includes conductive lines like the conductive lines 211a-211b and 212a-212b.

Figure 8A:
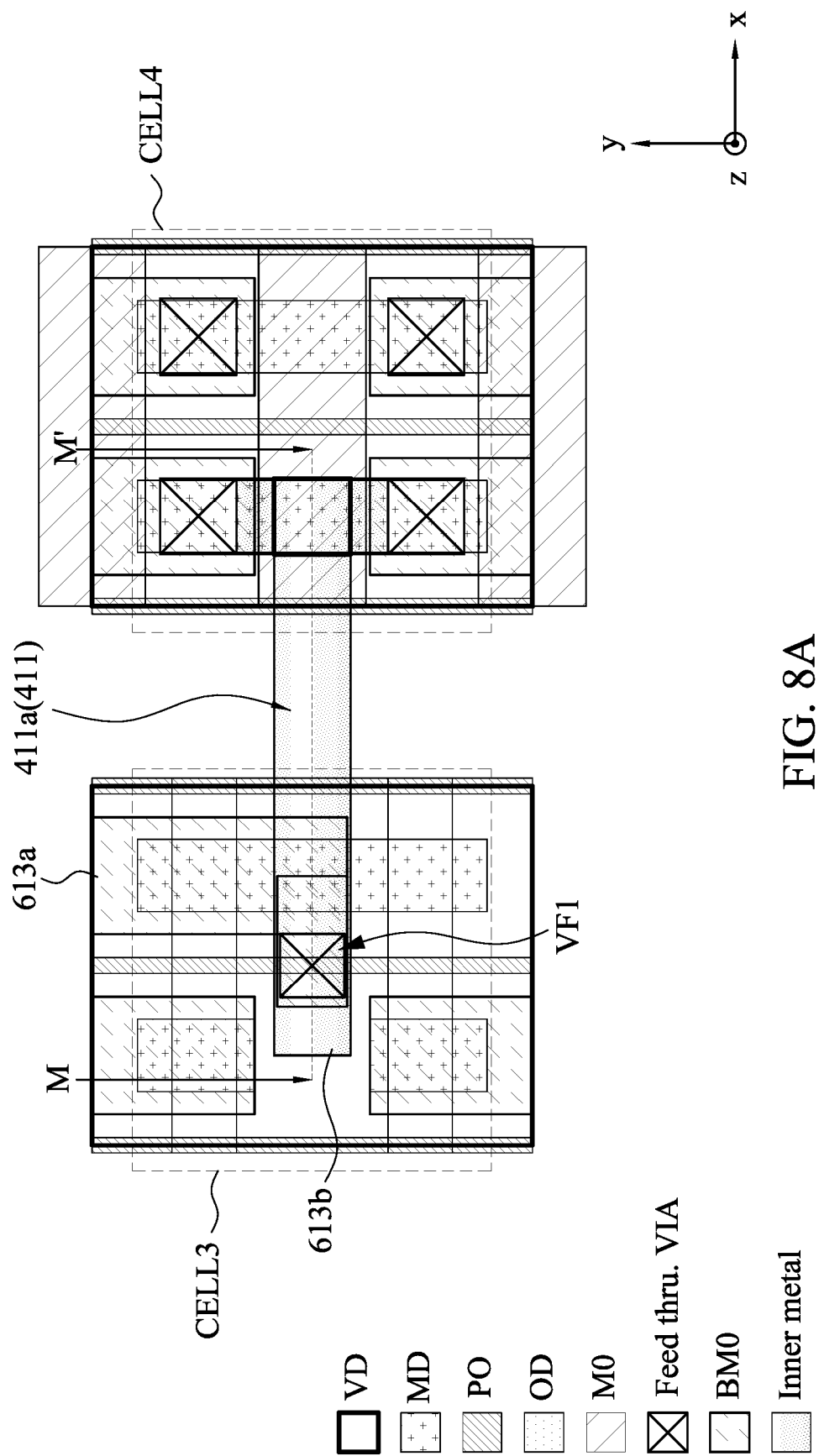
FIG. 8A is a layout diagram in a plan view of part of an integrated circuit, in accordance with various embodiments.

Reference is now made to FIG. 8A. FIG. 8A is a layout diagram in a plan view of part of an integrated circuit 800, in accordance with various embodiments. With respect to the embodiments of FIGS. 1A-6B, like elements in FIGS. 8A-8B are designated with the same reference numbers for ease of understanding.

Compared with FIG. 6A, the conductive line 613 further includes a first portion 613a extending in y direction and a second portion 613b extending in x direction. The second portion 613b further overlaps the gate 432 and the conductive line 411 in the layout view.

Figure 8B:
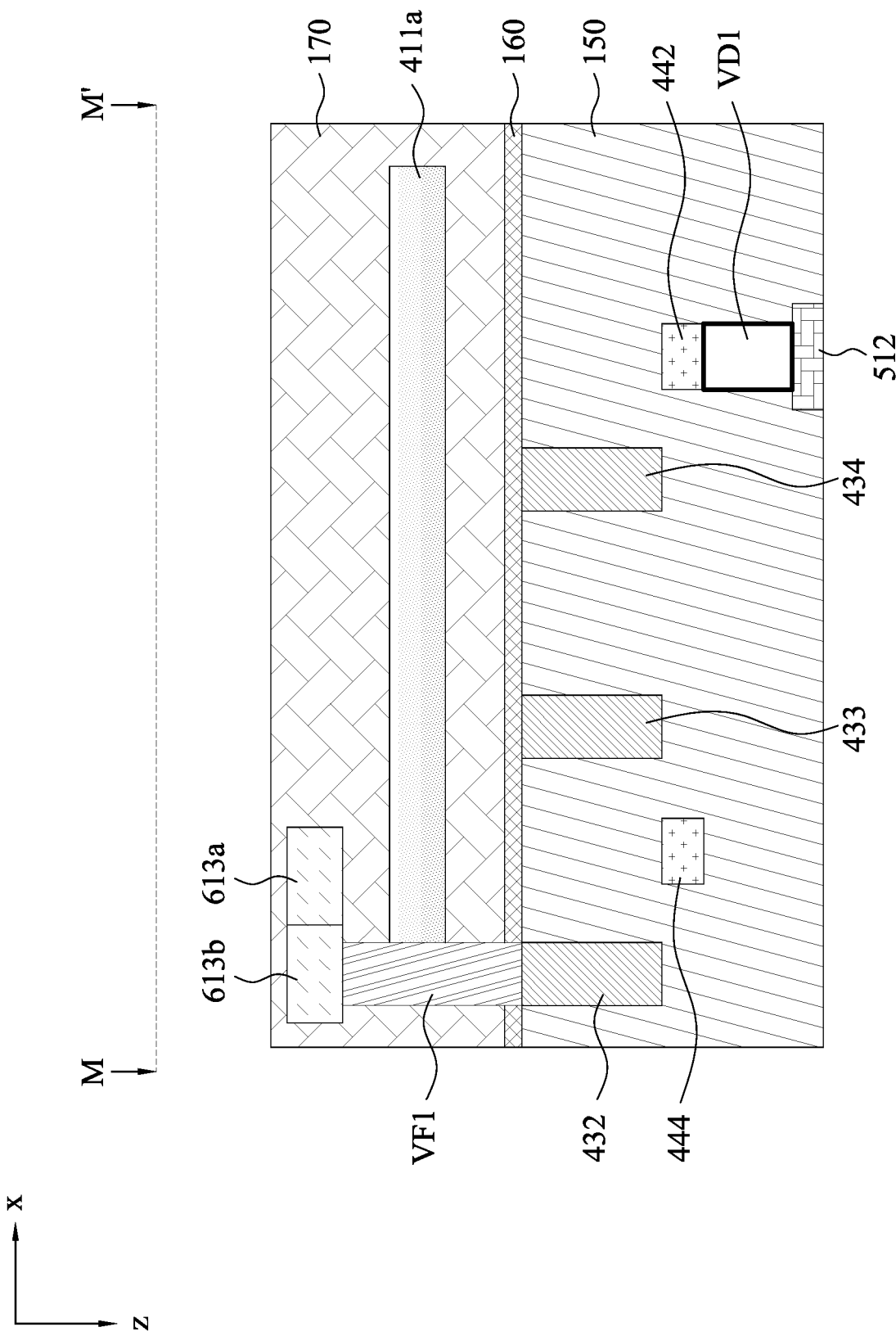
FIG. 8B is a cross-sectional view of part of the integrated circuit in FIG. 8A, taken along a line M-M' in FIG. 8A, in accordance with various embodiments.

Reference is now made to FIG. 8B. FIG. 8B is a cross-sectional view of part of the integrated circuit 800 in FIG. 8A, taken along the line M-M' in FIG. 8A, in accordance with various embodiments. For illustration, the feed-through via VF1 is coupled between the gate 432 and the second portion 613b of the conductive line 613. As shown in FIG. 8B, the second portion 613b of the conductive line 613 is further coupled to the conductive line 411 (i.e., the first portion 411a) through the feed-through via VF1.

The configurations of FIGS. 8A-8B are given for illustrative purposes. Various implements are within the contemplated scope of the present disclosure. For example, in some embodiments, instead of having conductive lines extending in y direction, the integrated circuit 800 includes conductive lines like the conductive lines 211a-211b and 212a-212b.

Figure 9:
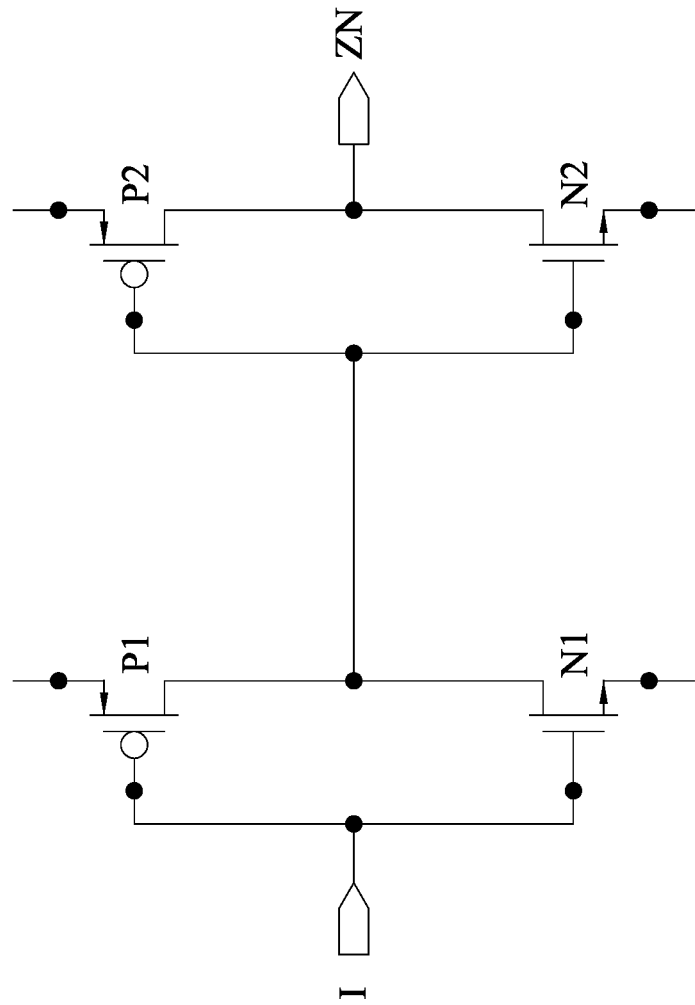
FIG. 9 is an equivalent circuit of part of an integrated circuit, in accordance with various embodiments.

FIG. 9 is an equivalent circuit of part of an integrated circuit 900, in accordance with various embodiments. The integrated circuit 900 includes transistors P1-P2 and N1-N2. For illustration, a first terminal of the transistor P1 and a first terminal of the transistor P2 are coupled to the supply voltage VDD. A second terminal of the transistor P1 is coupled to a first terminal of the transistor N1. A second terminal of the transistor N1 is coupled to the supply voltage VSS. A second terminal of the transistor P2 is coupled to a first terminal of the transistor N2. A second terminal of the transistor N2 is coupled to the supply voltage VSS. Gate terminals of the transistors P1 and N1 are coupled together at an input terminal I. Gate terminals of the transistors P2 and N2 are coupled together to the second terminal of the transistor P1 and the first terminal of the transistor N1. In some embodiments, the transistors P1-P2 are P-type. The transistors N1-N2 are N-type. The above implementation of the integrated circuit 900 is given for illustrative purposes. Various implementations of the integrated circuit 900 are within the contemplated scope of the present disclosure. For example, in some embodiments, the integrated circuit 900 is a logic gate circuit including AND, OR, NAND, MUX, Flip-flop, Latch, BUFF, inverter, or any other types of logic circuit.

Figure 10A:
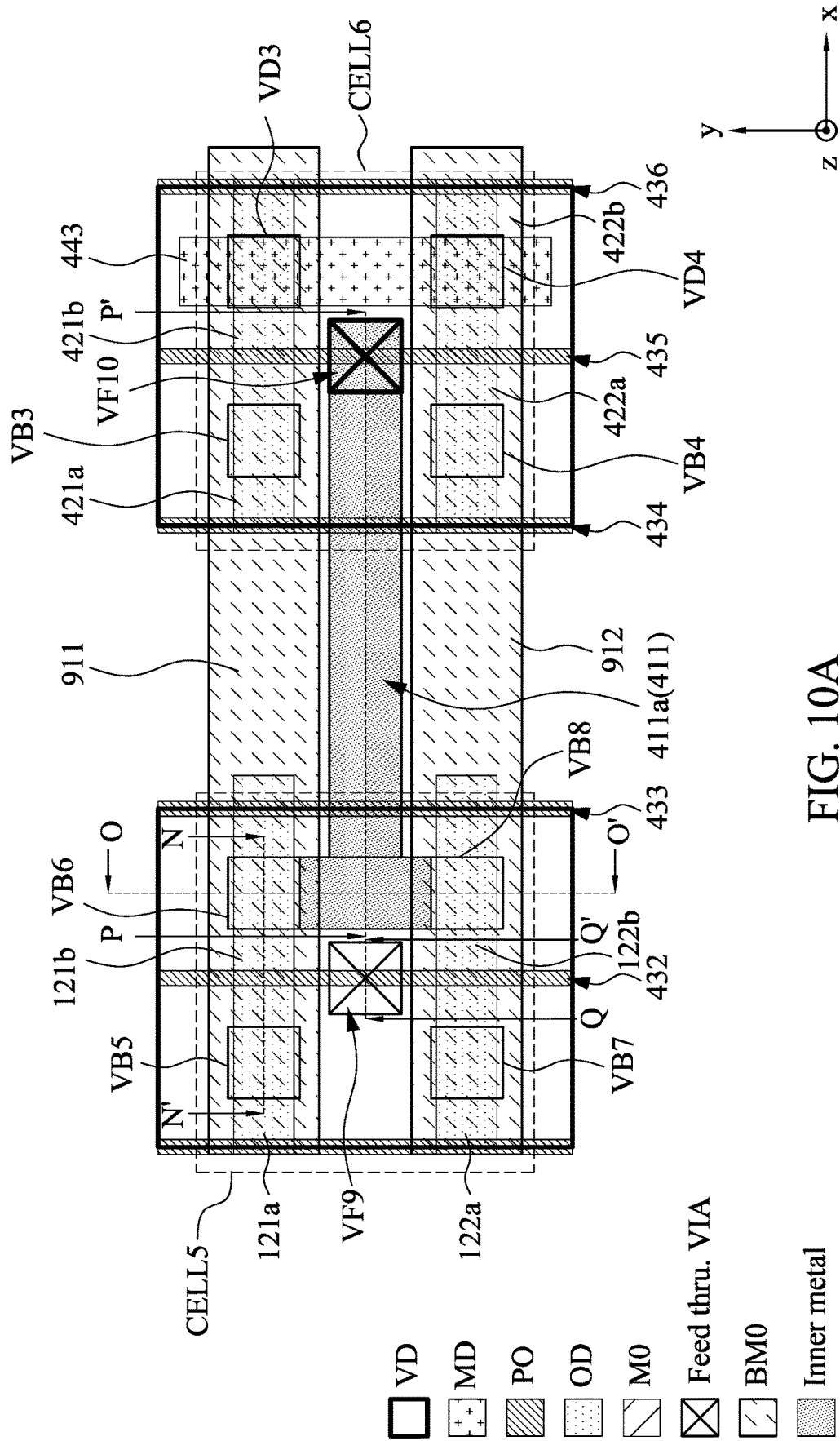
FIG. 10A is a layout diagram in a plan view of part of an integrated circuit, in accordance with various embodiments.

Reference is now made to FIG. 10A. FIG. 10A is a layout diagram in a plan view of part of an integrated circuit 900, in accordance with various embodiments. With respect to the embodiments of FIGS. 1A-9, like elements in FIGS. 10A-10D are designated with the same reference numbers for ease of understanding.

Compared with FIG. 5A, instead of having separate conductive lines 211a-211b and 212a-212b, the integrated circuit 900 includes extensive conductive lines 911-912 included in cells CELL5-CELL6. In some embodiments, the conductive lines 911-912 are configured with respect to, for example, the conductive line 211. In addition, active regions 121a-121b of the active area 121 and active regions 122a-122b of the active area 122 in the cell CELL5 are separated from active regions 421a-421b of the active area 421 and 422a-422b of the active area 422. In some embodiments, a cut layer is disposed between the cells CELL5-CELL6 to divide the active regions.

The integrated circuit 900 further includes vias VB3-VB8, VD3-VD4, and feed-through via VF9-VF10. In some embodiments, the vias VB5-VB8 are configured with respect to, for example, the via VB3. As shown in FIG. 10E, the feed-through via VF9 is coupled to a conductive line 412 which has a distance D3 at the backside away from the dielectric layer 160 for receiving an input signal at the input terminal I. In some embodiments, the distances D2-D3 are equal. In various embodiments, the distance D3 is larger than the distance D2. The feed-through via VF10 is configured with respect to, for example, the feed-through via VF1.

In the layout view, the vias VB3 and VB5-VB6 overlap the conductive line 911, and the vias VB4 and VB7-VB8 overlap the conductive line 912. The vias VB5-VB6 overlap the active regions 121a-121b respectively. The vias VB7-VB8 overlap the active regions 122a-122b respectively. The via VB3-VB4 overlap the active regions 421a and 422a respectively. The vias VD3-VD4 overlap the conductive segment 443 and further overlap the active regions 421b and 422b respectively. The feed-through vias VF9-VF10 overlap the gates 432 and 435 respectively.

In some embodiments, the gate 432 corresponds to the gates of the transistors P1 and N1, and the gate 435 corresponds to the gates of the transistors P2 and N2. The vias VB5-VB6 correspond to the first terminal and the second terminal of the transistor P1. The vias VB7-VB8 correspond to the second terminal and the first terminal of the transistor P1. The vias VB3 corresponds to the first terminal of the transistor P2. The vias VB4 corresponds to the second terminal of the transistor N2. The vias VD3 corresponds to the second terminal of the transistor P2. The vias VB4 corresponds to the first terminal of the transistor N2.

In some embodiments, the via VB3 is coupled between the conductive line 911 and the active region 421a to receive the supply voltage VDD to the cell CELL6. The via VB4 is coupled between the conductive line 912 and the active region 422a to receive the supply voltage VSS to the cell CELL6. Similarly, the via VB5 is coupled between the conductive line 911 and the active region 121a to receive the supply voltage VDD to the cell CELL5. The via VB7 is coupled between the conductive line 912 and the active region 122a to receive the supply voltage VSS to the cell CELL5.

As shown in FIG. 10A, the conductive line 411 is interposed between the conductive lines 911-912. The first portion 411a of the conductive line 411 overlaps the feed-through via VF10. The second portion 411b of the conductive line 411 extends between the vias VB6 and VB8.

Figures 10B, 10C:
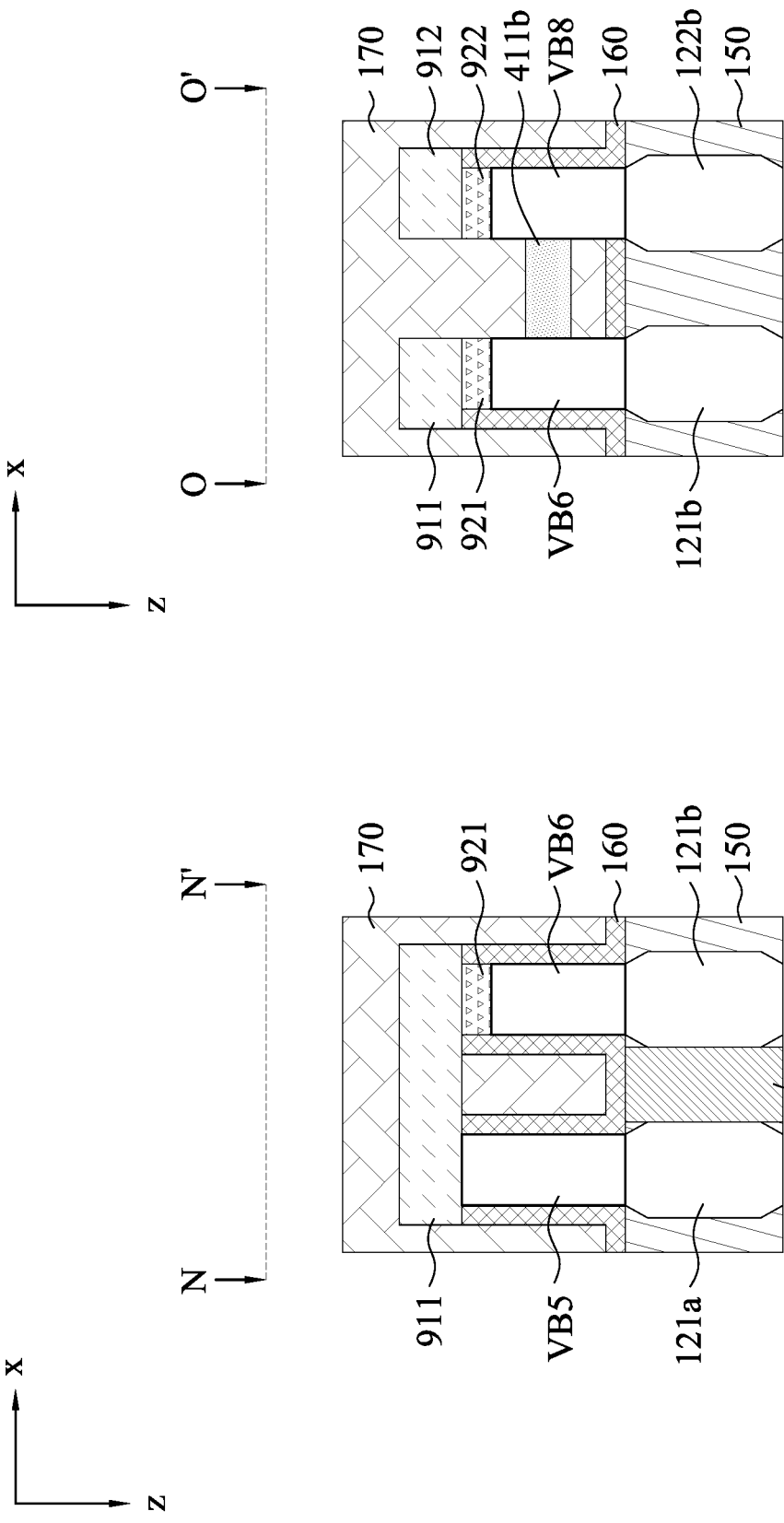
FIG. 10B is a cross-sectional view of part of the integrated circuit in FIG. 10A, taken along a line N-N' in FIG. 10A, in accordance with various embodiments.
FIG. 10C is a cross-sectional view of part of the integrated circuit in FIG. 10A, taken along a line O-O' in FIG. 10A, in accordance with various embodiments.

Reference is now made to FIG. 10B. FIG. 10B is a cross-sectional view of part of the integrated circuit 900 in FIG. 10A, taken along the line N-N' in FIG. 10A, in accordance with various embodiments. For illustration, the vias VB5-VB6 are surrounded by the dielectric layer 160. The integrated circuit 900 further includes an isolating layer 921 between the conductive line 911 and the via VB6 to isolate the conductive line 911 with the active region 121b.

In some embodiments, the isolating layer 921 includes $SiO_2$, $Si_3N_4$, $SiO_xN_y$, SiC, SiCN films, SiOC, SiOCN films, and/or combinations thereof.

Reference is now made to FIG. 10C. FIG. 10C is a cross-sectional view of part of the integrated circuit 900 in FIG. 10A, taken along the line O-O' in FIG. 10A, in accordance with various embodiments. For illustration, the integrated circuit 900 further includes an isolating layer 922 between the conductive line 912 and the via VB8 to isolate the conductive line 912 with the active region 122b. In some embodiments, the isolating layer 922 is configured with respect to, for example, the isolating layer 921. Furthermore, the second portion 411b of the conductive line 411 is coupled to the vias VB6 and VB8. Accordingly, with reference to FIGS. 9 and 10C, the second terminal of the transistor P1 is coupled to the first terminal of the transistor N1.

Figure 10D:
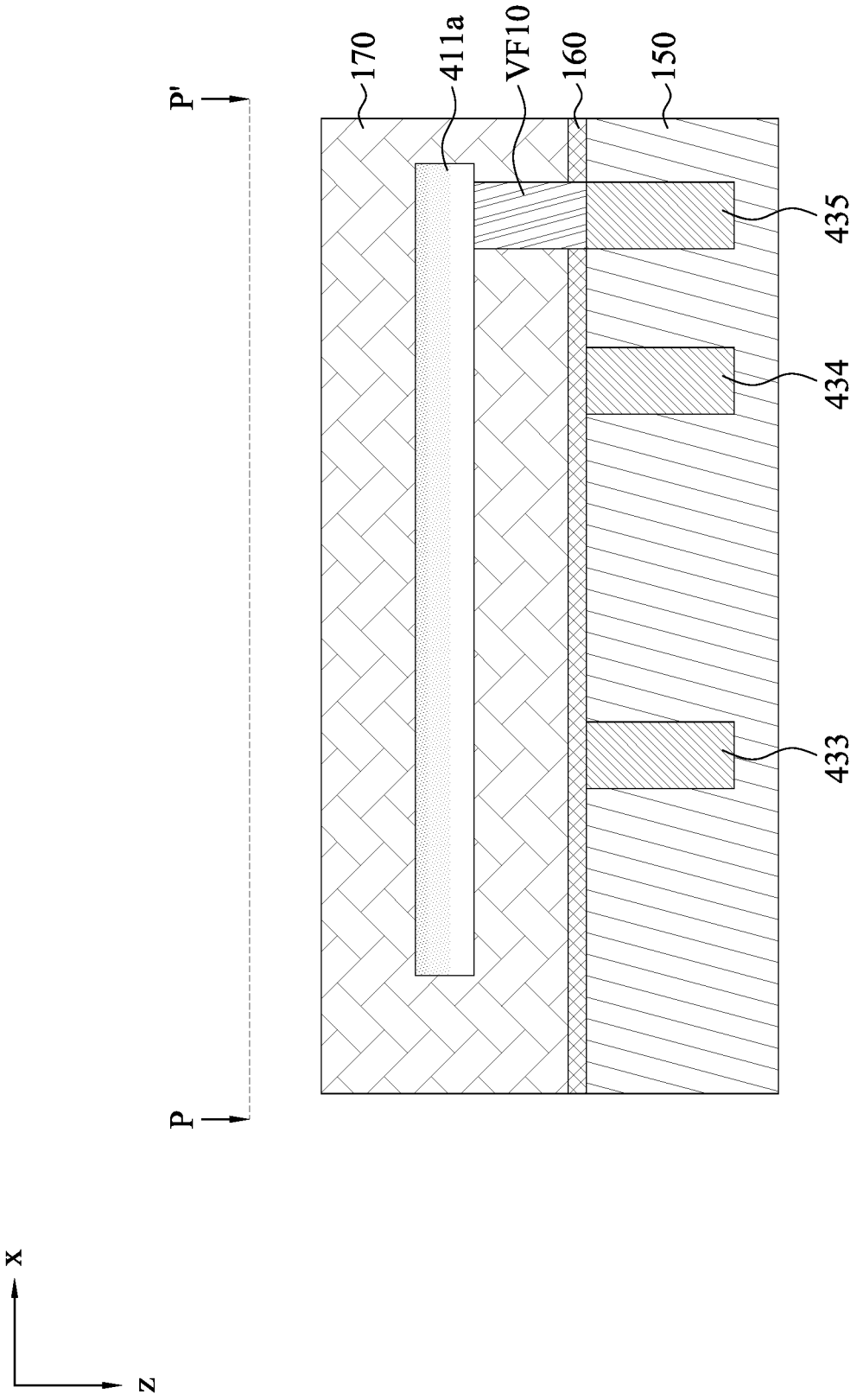
FIG. 10D is a cross-sectional view of part of the integrated circuit in FIG. 10A, taken along a line P-P' in FIG. 10A, in accordance with various embodiments.
Figure 10E:
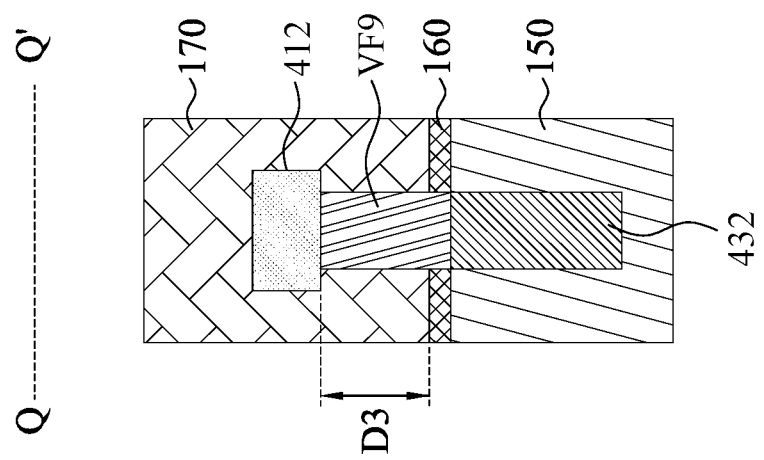
FIG. 10E is a cross-sectional view of part of the integrated circuit in FIG. 10A, taken along a line Q-Q' in FIG. 10A, in accordance with various embodiments.

Reference is now made to FIG. 10D. FIG. 10D is a cross-sectional view of part of the integrated circuit 900 in FIG. 10A, taken along the line P-P' in FIG. 10A, in accordance with various embodiments. For illustration, the first portion 411a of the conductive line 411 is coupled to the gate 435 through the feed-through via VF10.

According to FIGS. 9-10D, in some embodiments, a backside signal from the cell CELL5 is transmitted to the cell CELL6 through the backside conductive line 411. Compared with some approaches utilizing front side metal layers to transmit the logic signal, the front side metal resource of the present disclosure is preserved for other application by using backside metal layer (i.e., the conductive line 411) to transmit logic signals.

The configurations of FIGS. 10A-10D are given for illustrative purposes. Various implements are within the contemplated scope of the present disclosure. For example, in some embodiments, the integrated circuit 900 further includes conductive lines (backside metal layers BM1 extending in y direction, backside metal layers BM2 extending in y direction . . . , etc.) disposed in the layers on the backside of the integrated circuit 900.

Figure 11:
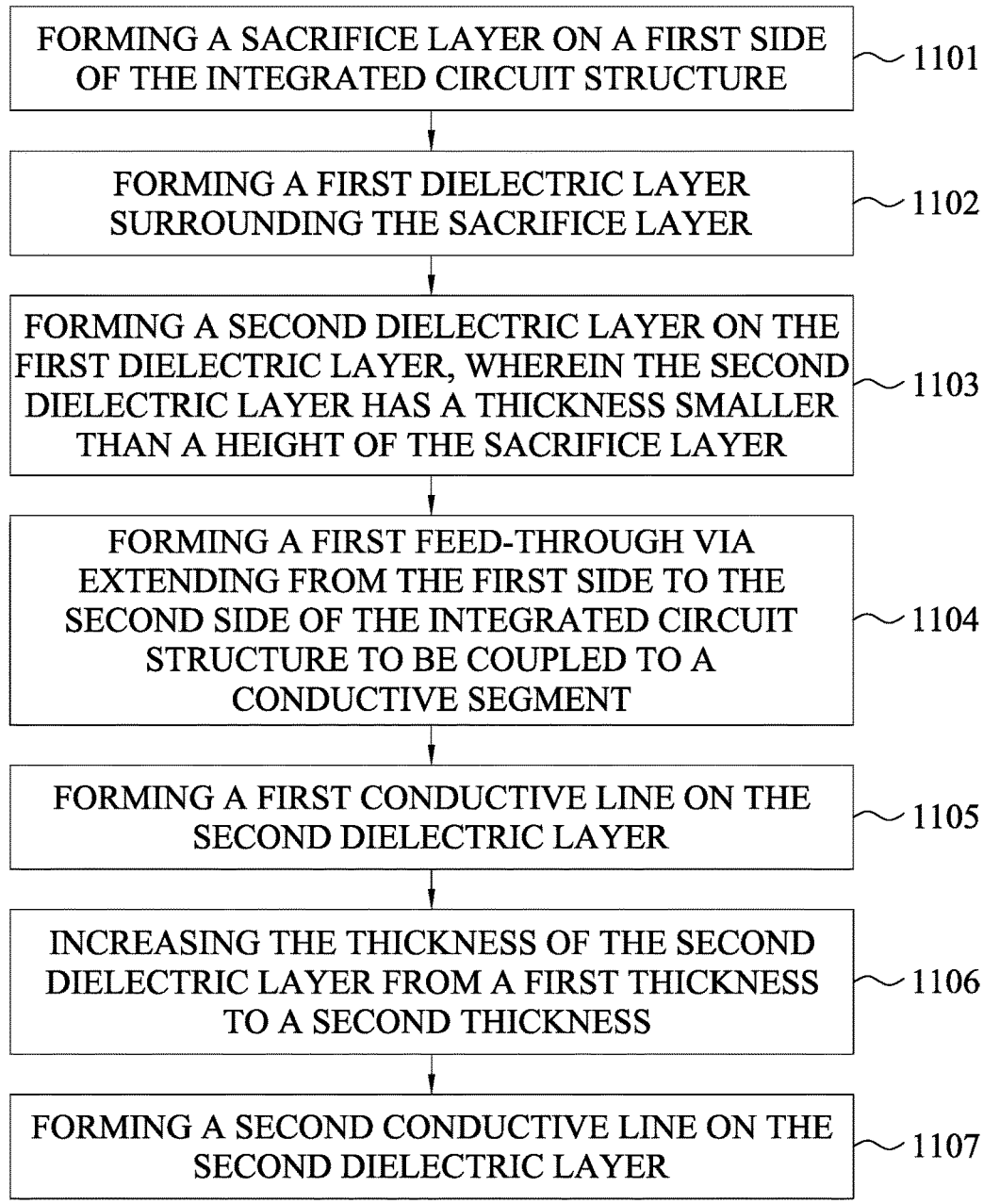
FIG. 11 is a flow chart of a method of manufacturing an integrated circuit, in accordance with some embodiments of the present disclosure.

Reference is now made to FIG. 11 and FIGS. 12A to 12I. FIG. 11 is a flow chart of a method 1100 of manufacturing the integrated circuit 100-800, or 900 or an integrated circuit 1200 shown in FIGS. 12A to 12I, in accordance with some embodiments of the present disclosure. In some embodiments, the integrated circuit 1200 includes structures similar to elements in the integrated circuits 100-900. FIGS. 12A to 12I are schematic diagrams, in cross-sectional view of part of the integrated circuit 1200, illustrating various processes of the method 1100 of FIG. 11, in accordance with some embodiments of the present disclosure. It is understood that additional operations can be provided before, during, and after the processes shown by FIG. 11 and FIGS. 12A to 12I, and some of the operations described below can be replaced or eliminated, for additional embodiments of the method. The order of the operations/processes may be interchangeable. Throughout the various views and illustrative embodiments, like reference numbers are used to designate like elements.

Figures 12A, 12B:
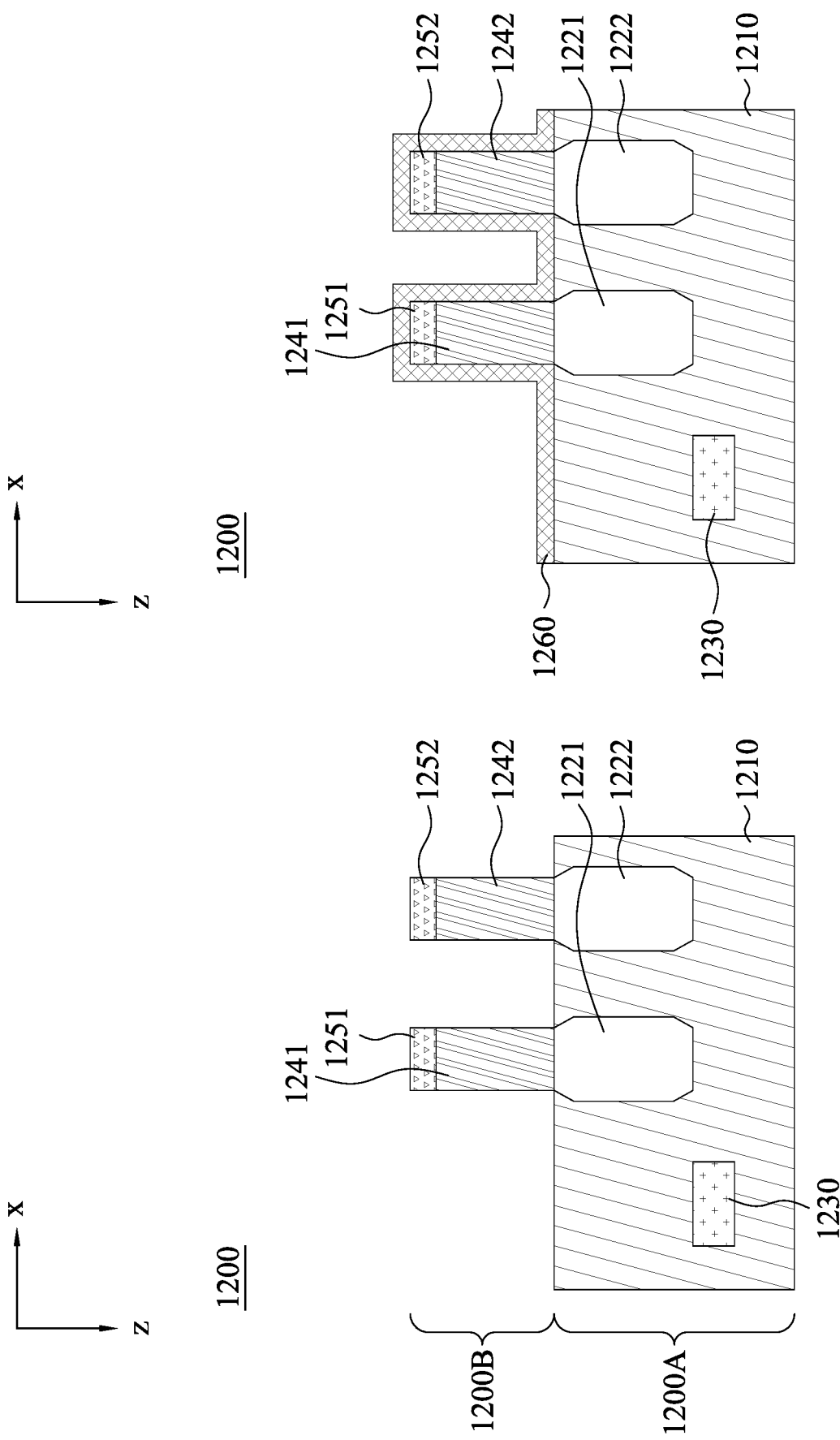
FIGS. 12A to 12I are schematic diagrams, in cross-sectional view of part of an integrated circuit, illustrating various processes of the method of FIG. 11, in accordance with some embodiments of the present disclosure.

In operation 1101, sacrifice layers 1241-1242 are formed on a first side (backside) 1200B of the integrated circuit (structure) 1200. As shown in FIG. 12A, an active semiconductor device, including active regions 1221-1222 and a conductive segment 1230, is formed on a second side (front side) 1200A, opposite of the first side, of the integrated circuit 1200. In some embodiments, the active semiconductor device is formed in the front side process. After the front side process is complete, the integrated circuit 1200 is flipped upside down, such that a backside surface of the substrate faces upwards. The substrate is further thinned down and removed, and the operation 1101 is performed to the integrated circuit 1200.

In some embodiments, as illustratively shown in FIG. 12A, the method 1100 further includes forming isolating layers 1251-1252 on the sacrifice layers 1241-1242 respectively. In some embodiments, the formation of the isolating layers 1251-1252 includes forming an isolating layer cover the dielectric layer 1210 and the sacrifice layers 1241-1242. And then, a mask is utilized to pattern the isolating layers 1251-1252.

In some embodiments, the dielectric layer 1210 is configured with respect to, for example, the dielectric layer 150. The active regions 1221-1222 is configured with respect to, for example, part of the active areas 121-122. The conductive segment 1230 is configured with respect to, for example, the conductive segment 148. The sacrifice layers 1241-1242 are configured with respect to, for example, the dielectric layer 220.

In operation 1102, as illustratively shown in FIG. 12B, the dielectric layer 1260 is formed to surround the sacrifice layers 1241-1242 and the isolating layers 1251-1252 above the dielectric layer 1210. In some embodiments, the dielectric layer 1260 is configured with respect to, for example, the dielectric layer 150. In some embodiments, the formation of the dielectric layer 1260 includes, for example, deposition, chemical mechanical polish (CMP) and etches.

Figures 12C, 12D:
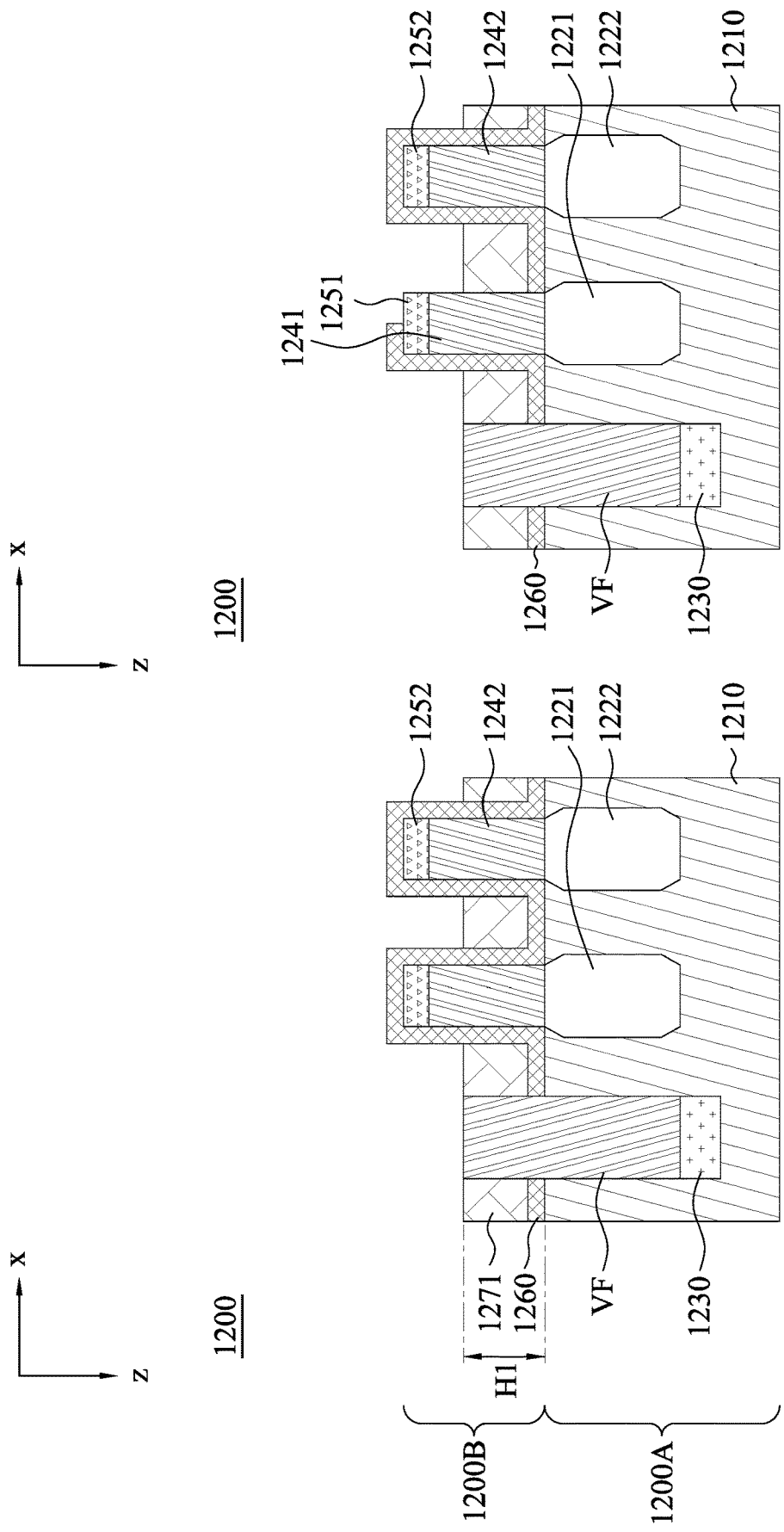

In operation 1103, as illustratively shown in FIG. 12C, forming a dielectric layer 1271 on the dielectric layer 1260. The dielectric layer 1271 has a thickness H1 smaller than a height of the sacrifice layers 1241-1242. The formation of the dielectric layer 1271 is similar to that of the dielectric layer 1260. In some embodiments, the dielectric layer 1271 is configured with respect to, for example, the dielectric layer 170.

In operation 1104, as illustratively shown in FIG. 12C, forming a feed-through via VF is formed and extends from the first side 1200B to the second side 1200A of the integrated circuit 1200 to be coupled to the conductive segment 1230. In some embodiments, the feed-through via VF is configured with respect to, for example, the feed-through via VF1. In some embodiments, the formation of the feed-through via VF includes forming a trench extending from the dielectric layer 1271 to the dielectric layer 1210. After the trench is formed, conductive materials, such like tungsten, cobalt, copper, the like or combinations thereof, is formed in the trench by using suitable deposition techniques (e.g., CVD, PVD, ALD, the like or combinations thereof), followed by a CMP process to remove excess metal materials outside the trench.

In some embodiments, the method 1100 further includes forming the feed-through via VF1 extending from the first side 1200B to the second side 1200A and coupled to a gate structure on the second side 1200A of the integrated circuit 1200, as shown in FIG. 1C.

In some embodiments, as shown in FIG. 12D, the method 1100 further includes removing a portion of the dielectric layer 1260 on sides of the isolating 1251. For illustration, part of the isolating layer 1251 and part of the sacrifice layer 1241 are exposed by removing portions of the dielectric layer 1260 contacting thereto. In some embodiments, a mask is utilized to cover the remaining portions of the dielectric layer 1260 and the dielectric layer 1271, and an etch process is performed to remove portions of the dielectric layer 1260, as shown in FIG. 12D.

Figures 12E, 12F:
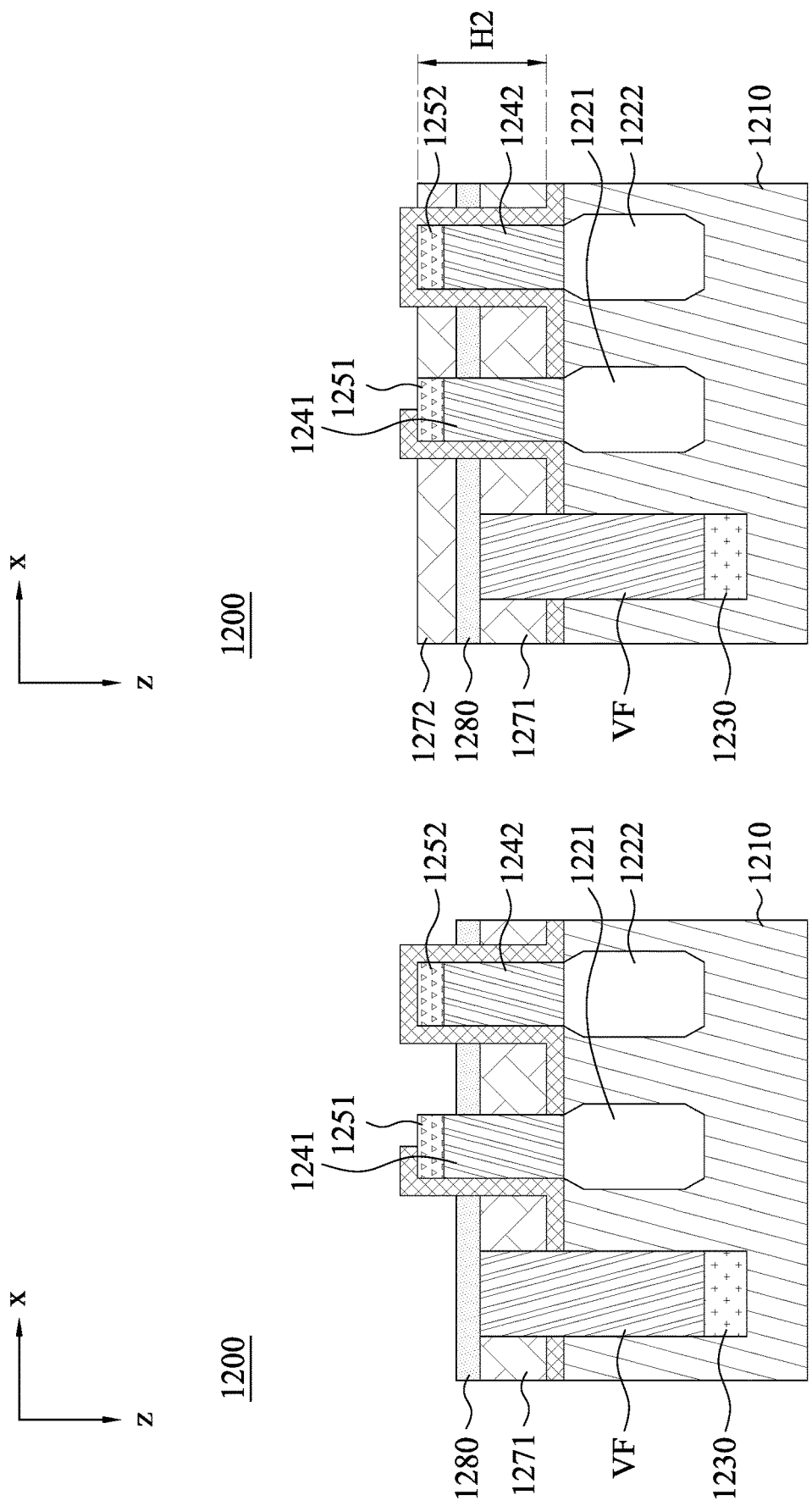

In operation 1105, as shown in FIG. 12E, a conductive line 1280 is formed on the dielectric layer 1271. A portion of the conductive line 1280 contacts a side of the sacrifice layer 1241, and another portion of the conductive line 1280 contacts the feed-through via VF. The sacrifice layer 1242 does not contact the conductive line 1280. In some embodiments, the conductive line 1280 is configured with respect to, for example, the conductive lines 213 and 411. In some embodiments, the formation of the conductive line 1280 includes, for example, deposition, chemical mechanical polish (CMP) and etches. In various embodiments, the conductive line 1280 includes metal materials such as copper, aluminum, tungsten, combinations thereof, or the like.

In operation 1106, as shown in FIG. 12F, a dielectric layer 1272 is formed on the conductive line 1280, as shown in FIG. 12F. In some embodiments, the dielectric layer 1272 is configured with respect to, for example, the dielectric layer 1271. Alternatively stated, a thickness of a dielectric layer including the dielectric layers 1271-1272 increases from the thickness H1 to a thickness H2.

Figures 12G, 12H:
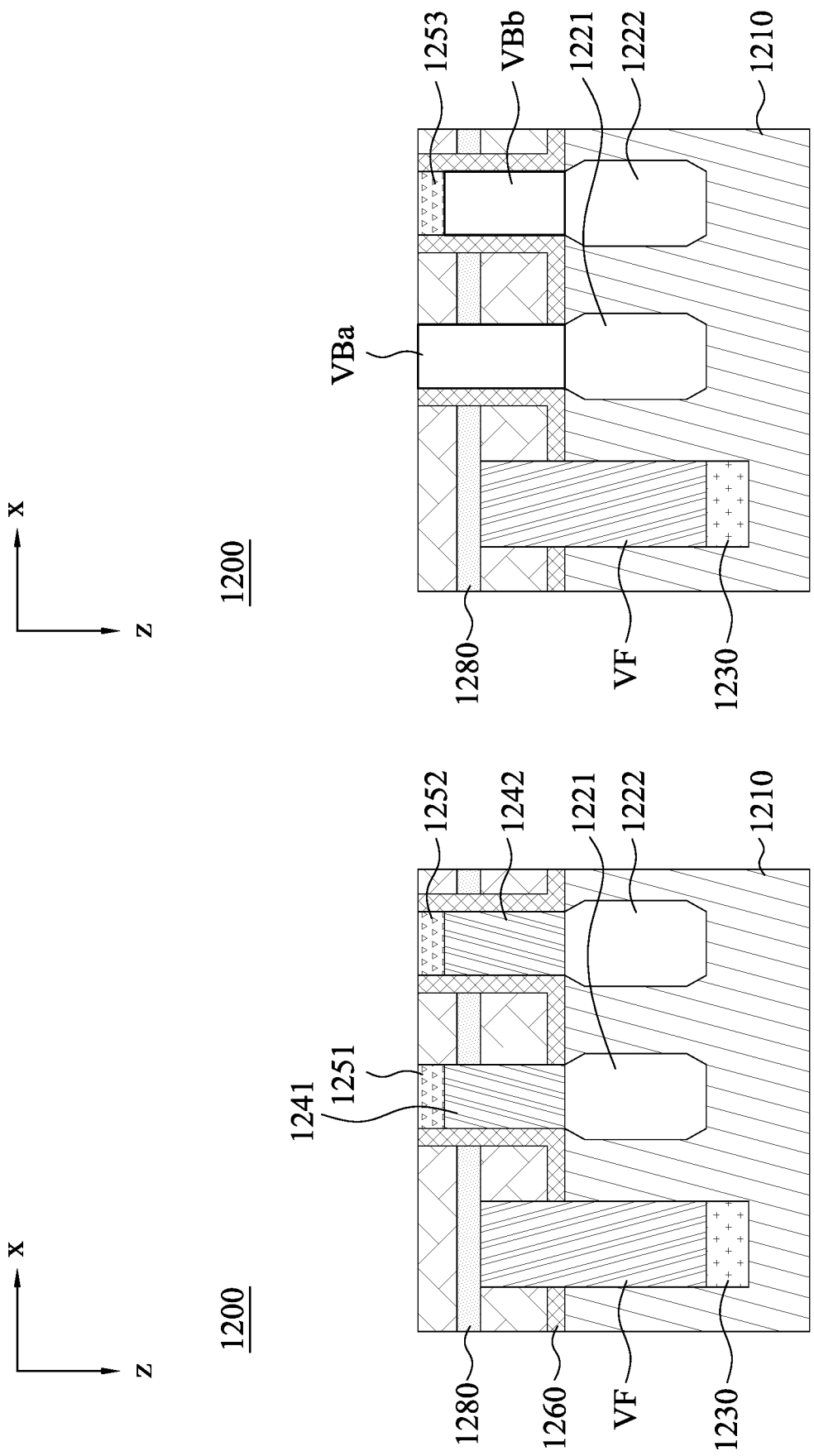

In some embodiments, the method 1100 further includes removing the portion of the dielectric layer 1260 excessing the dielectric layer 1272, as shown in FIG. 12G. In some embodiments, the process includes chemical mechanical polish (CMP) and etches.

In some embodiments, as shown in FIG. 12H, the method 1100 further includes removing the sacrifice layer 1241 and the isolating layer 1251 in FIG. 12G and forming a via VBa contacting the active region 1221. Accordingly, the via VBa is coupled to the conductive line 1280. In addition, another via VBb is forming by removing the sacrifice layer 1242 and the isolating layer 1252 in FIG. 12G, and an isolating layer 1253 is formed on the via VBb. In some embodiments, the formation of the vias VBa-VBb includes, for example, etches, deposition, and chemical mechanical polish (CMP). In some embodiments, the vias VBa-VBb are configured with respect to, for example, the vias VB3 and VB2 respectively.

Figure 12I:
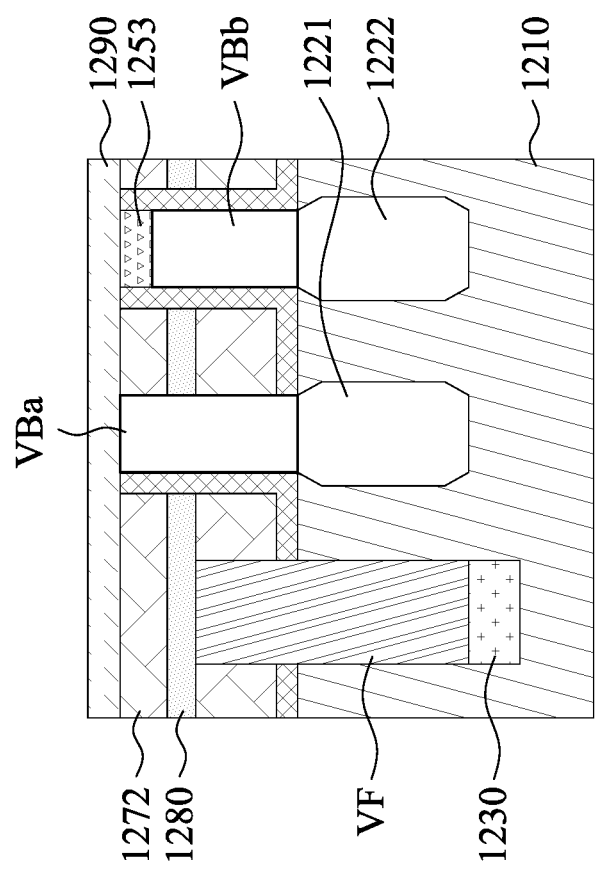

In operation 1107, as shown in FIG. 12I, a conductive line 1290 is formed on the dielectric layer 1272. For illustration, the conductive line 1290 contacts the via VBa and the isolating layer 1253. Accordingly, the conductive line 1290 is coupled to the via VBa and is isolated from the VBb by the isolating layer 1253. In some embodiments, the formation of the conductive line 1290 includes, for example, deposition, chemical mechanical polish (CMP) and etches. In some embodiments, the conductive line 1290 is configured with respect to, for example, the conductive line 911.

Figure 13:
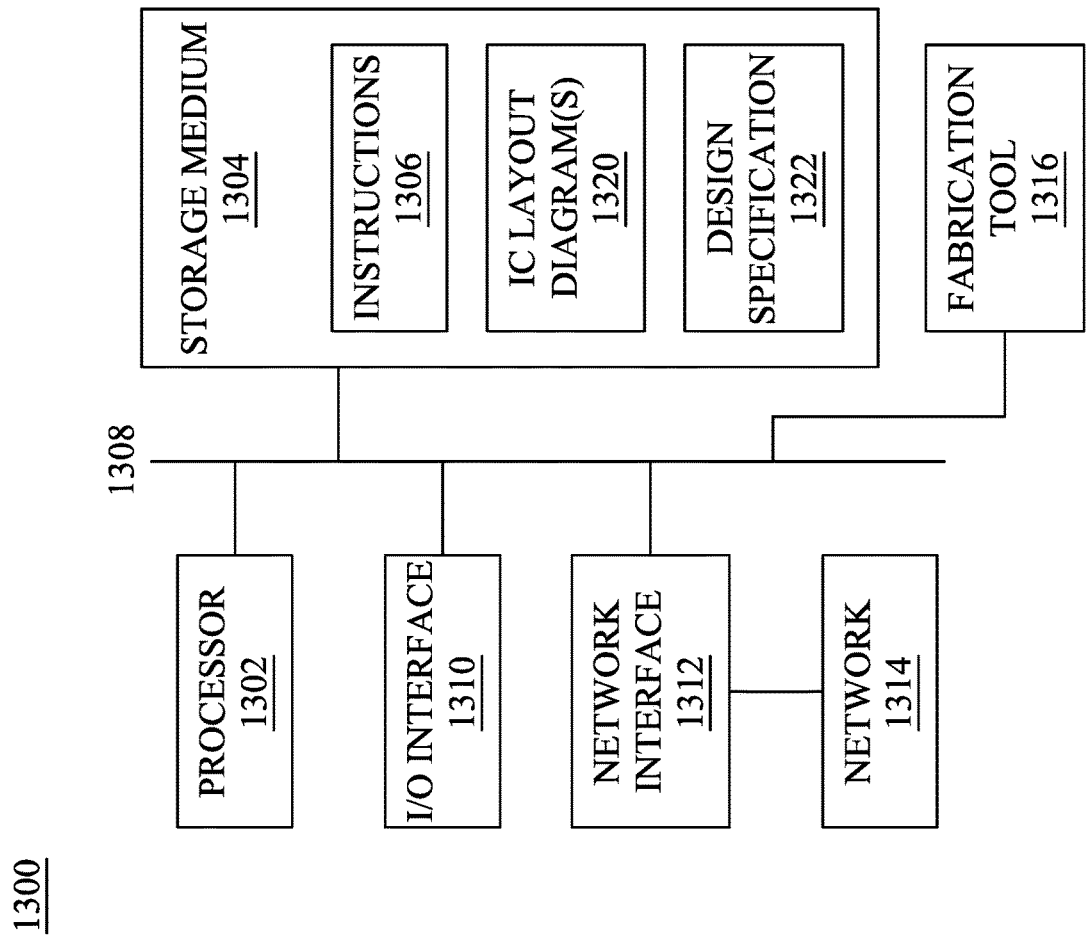
FIG. 13 is a block diagram of a system for designing the integrated circuit layout design, in accordance with some embodiments of the present disclosure.

Reference is now made to FIG. 13. FIG. 13 is a block diagram of an electronic design automation (EDA) system 1300 for designing the integrated circuit layout design, in accordance with some embodiments of the present disclosure. EDA system 1300 is configured to implement one or more operations of the method 1100 disclosed in FIG. 11, and further explained in conjunction with FIGS. 1A-11. In some embodiments, EDA system 1300 includes an APR system.

In some embodiments, EDA system 1300 is a general purpose computing device including a hardware processor 1302 and a non-transitory, computer-readable storage medium 1304. Storage medium 1304, amongst other things, is encoded with, i.e., stores, computer program code (instructions) 1306, i.e., a set of executable instructions. Execution of instructions 1306 by hardware processor 1302 represents (at least in part) an EDA tool which implements a portion or all of, e.g., the method 1100.

The processor 1302 is electrically coupled to computer-readable storage medium 1304 via a bus 1308. The processor 1302 is also electrically coupled to an I/O interface 1310 and a fabrication tool 1316 by bus 1308. A network interface 1312 is also electrically connected to processor 1302 via bus 1308. Network interface 1312 is connected to a network 1314, so that processor 1302 and computer-readable storage medium 1304 are capable of connecting to external elements via network 1314. The processor 1302 is configured to execute computer program code 1306 encoded in computer-readable storage medium 1304 in order to cause EDA system 1300 to be usable for performing a portion or all of the noted processes and/or methods. In one or more embodiments, processor 1302 is a central processing unit (CPU), a multi-processor, a distributed processing system, an application specific integrated circuit (ASIC), and/or a suitable processing unit.

In one or more embodiments, computer-readable storage medium 1304 is an electronic, magnetic, optical, electromagnetic, infrared, and/or a semiconductor system (or apparatus or device). For example, computer-readable storage medium 1304 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1304 includes a compact disk-read only memory (CD-ROM), a compact disk-read/write (CD-R/W), and/or a digital video disc (DVD).

In one or more embodiments, storage medium 1304 stores computer program code 1306 configured to cause EDA system 1300 (where such execution represents (at least in part) the EDA tool) to be usable for performing a portion or all of the noted processes and/or methods. In one or more embodiments, storage medium 1304 also stores information which facilitates performing a portion or all of the noted processes and/or methods. In one or more embodiments, storage medium 1304 stores IC layout diagram 1320 of standard cells including such standard cells as disclosed herein, for example, a cell including in the integrated circuits 100-900 and/or 1200 discussed above with respect to FIGS. 1A-10D and 12A to 12I.

EDA system 1300 includes I/O interface 1310. I/O interface 1310 is coupled to external circuitry. In one or more embodiments, I/O interface 1310 includes a keyboard, keypad, mouse, trackball, trackpad, touchscreen, and/or cursor direction keys for communicating information and commands to processor 1302.

EDA system 1300 also includes network interface 1312 coupled to processor 1302. Network interface 1312 allows EDA system 1300 to communicate with network 1314, to which one or more other computer systems are connected. Network interface 1312 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1300.

EDA system 1300 also includes the fabrication tool 1316 coupled to processor 1302. The fabrication tool 1316 is configured to fabricate integrated circuits, e.g., the integrated circuits 100-900 and/or 1200 illustrated in FIGS. 1A-10D and 12A to 12I, according to the design files processed by the processor 1302.

EDA system 1300 is configured to receive information through I/O interface 1310. The information received through I/O interface 1310 includes one or more of instructions, data, design rules, libraries of standard cells, and/or other parameters for processing by processor 1302. The information is transferred to processor 1302 via bus 1308.

EDA system 1300 is configured to receive information related to a UI through I/O interface 1310. The information is stored in computer-readable medium 1304 as design specification 1322.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1300. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, for example, one or more of an optical disk, such as a DVD, a magnetic disk, such as a hard disk, a semiconductor memory, such as a ROM, a RAM, a memory card, and the like.

Figure 14:
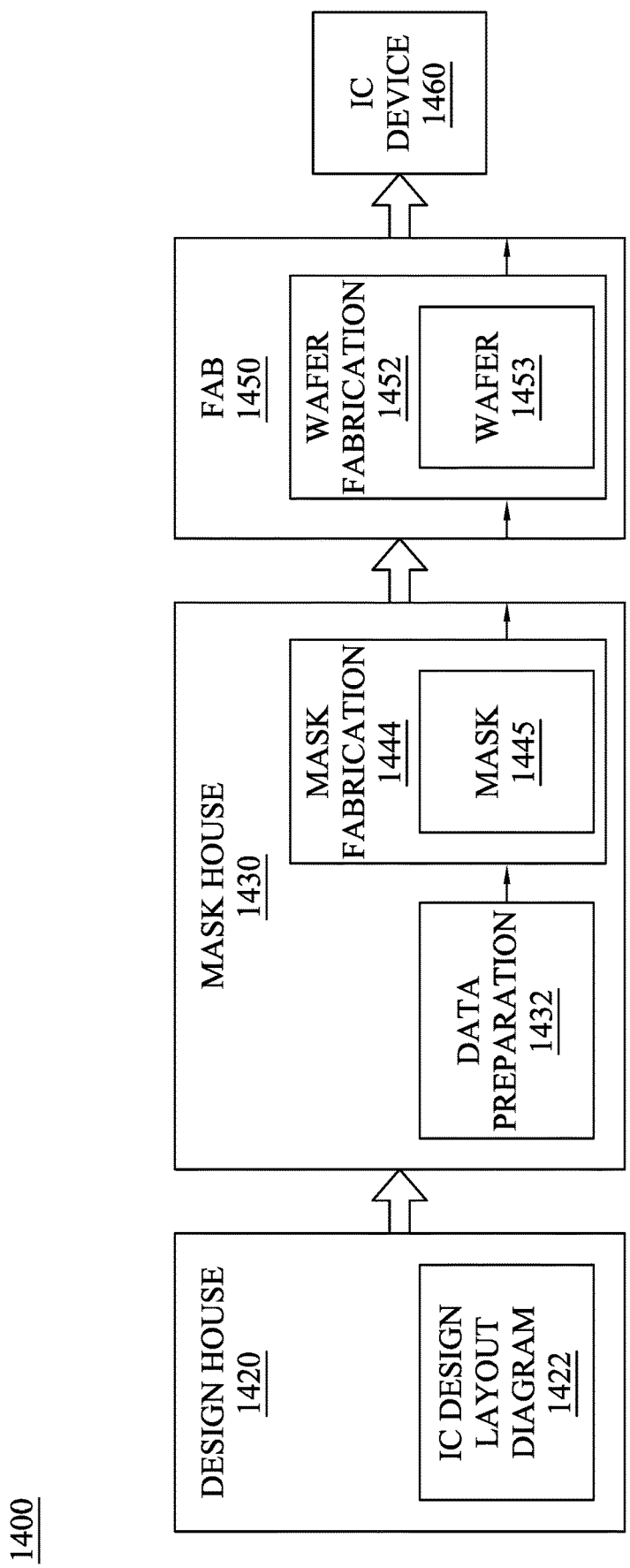
FIG. 14 is a block diagram of an integrated circuit manufacturing system, and an integrated circuit manufacturing flow associated therewith, in accordance with some embodiments.

FIG. 14 is a block diagram of IC manufacturing system 1400, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using IC manufacturing system 1400.

In FIG. 14, IC manufacturing system 1400 includes entities, such as a design house 1420, a mask house 1430, and an IC manufacturer/fabricator ("fab") 1450, that interact with one another in the design, development, and manufacturing cycles and/or services related to manufacturing an IC device 1460. The entities in IC manufacturing system 1400 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1420, mask house 1430, and IC fab 1450 is owned by a single larger company. In some embodiments, two or more of design house 1420, mask house 1430, and IC fab 1450 coexist in a common facility and use common resources.

Design house (or design team) 1420 generates an IC design layout diagram 1422. IC design layout diagram 1422 includes various geometrical patterns, for example, an IC layout design depicted in FIGS. 1A, 2A, 3A, 4A, 5A, 6A, 7A, 8A, and/or 10A, designed for an IC device 1460, for example, integrated circuits 100-900 discussed above with respect to 1A, 2A, 3A, 4A, 5A, 6A, 7A, 8A, and/or 10A. The geometrical patterns correspond to patterns of metal, oxide, or semiconductor layers that make up the various components of IC device 1460 to be fabricated. The various layers combine to form various IC features. For example, a portion of IC design layout diagram 1422 includes various IC features, such as an active region, gate electrode, source and drain, conductive segments or vias of an interlayer interconnection, to be formed in a semiconductor substrate (such as a silicon wafer) and various material layers disposed on the semiconductor substrate. Design house 1420 implements a proper design procedure to form IC design layout diagram 1422. The design procedure includes one or more of logic design, physical design or place and route. IC design layout diagram 1422 is presented in one or more data files having information of the geometrical patterns. For example, IC design layout diagram 1422 can be expressed in a GDSII file format or DFII file format.

Mask house 1430 includes data preparation 1432 and mask fabrication 1444. Mask house 1430 uses IC design layout diagram 1422 to manufacture one or more masks 1445 to be used for fabricating the various layers of IC device 1460 according to IC design layout diagram 1422. Mask house 1430 performs mask data preparation 1432, where IC design layout diagram 1422 is translated into a representative data file ("RDF"). Mask data preparation 1432 provides the RDF to mask fabrication 1444. Mask fabrication 1444 includes a mask writer. A mask writer converts the RDF to an image on a substrate, such as a mask (reticle) 1445 or a semiconductor wafer 1453. The IC design layout diagram 1422 is manipulated by mask data preparation 1432 to comply with particular characteristics of the mask writer and/or requirements of IC fab 1450. In FIG. 14, data preparation 1432 and mask fabrication 1444 are illustrated as separate elements. In some embodiments, data preparation 1432 and mask fabrication 1444 can be collectively referred to as mask data preparation.

In some embodiments, data preparation 1432 includes optical proximity correction (OPC) which uses lithography enhancement techniques to compensate for image errors, such as those that can arise from diffraction, interference, other process effects and the like. OPC adjusts IC design layout diagram 1422. In some embodiments, data preparation 1432 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, data preparation 1432 includes a mask rule checker (MRC) that checks the IC design layout diagram 1422 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1422 to compensate for limitations during mask fabrication 1444, which may undo part of the modifications performed by OPC in order to meet mask creation rules.

In some embodiments, data preparation 1432 includes lithography process checking (LPC) that simulates processing that will be implemented by IC fab 1450 to fabricate IC device 1460. LPC simulates this processing based on IC design layout diagram 1422 to create a simulated manufactured device, such as IC device 1460. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1422.

It should be understood that the above description of data preparation 1432 has been simplified for the purposes of clarity. In some embodiments, data preparation 1432 includes additional features such as a logic operation (LOP) to modify the IC design layout diagram 1422 according to manufacturing rules. Additionally, the processes applied to IC design layout diagram 1422 during data preparation 1432 may be executed in a variety of different orders.

After data preparation 1432 and during mask fabrication 1444, a mask 1445 or a group of masks 1445 are fabricated based on the modified IC design layout diagram 1422. In some embodiments, mask fabrication 1444 includes performing one or more lithographic exposures based on IC design layout diagram 1422. In some embodiments, an electron-beam (e-beam) or a mechanism of multiple e-beams is used to form a pattern on a mask (photomask or reticle) 1445 based on the modified IC design layout diagram 1422. Mask 1445 can be formed in various technologies. In some embodiments, mask 1445 is formed using binary technology. In some embodiments, a mask pattern includes opaque regions and transparent regions. A radiation beam, such as an ultraviolet (UV) beam, used to expose the image sensitive material layer (for example, photoresist) which has been coated on a wafer, is blocked by the opaque region and transmits through the transparent regions. In one example, a binary mask version of mask 1445 includes a transparent substrate (for example, fused quartz) and an opaque material (for example, chromium) coated in the opaque regions of the binary mask. In another example, mask 1445 is formed using a phase shift technology. In a phase shift mask (PSM) version of mask 1445, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1444 is used in a variety of processes. For example, such a mask(s) is used in an ion implantation process to form various doped regions in semiconductor wafer 1453, in an etching process to form various etching regions in semiconductor wafer 1453, and/or in other suitable processes.

IC fab 1450 includes wafer fabrication 1452. IC fab 1450 is an IC fabrication business that includes one or more manufacturing facilities for the fabrication of a variety of different IC products. In some embodiments, IC Fab 1450 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1450 uses mask(s) 1445 fabricated by mask house 1430 to fabricate IC device 1460. Thus, IC fab 1450 at least indirectly uses IC design layout diagram 1422 to fabricate IC device 1460. In some embodiments, semiconductor wafer 1453 is fabricated by IC fab 1450 using mask(s) 1445 to form IC device 1460. In some embodiments, the IC fabrication includes performing one or more lithographic exposures based at least indirectly on IC design layout diagram 1422. Semiconductor wafer 1453 includes a silicon substrate or other proper substrate having material layers formed thereon. Semiconductor wafer 1453 further includes one or more of various doped regions, dielectric features, multi-level interconnects, and the like (formed at subsequent manufacturing steps).

As described above, integrated circuits in the present disclosure include metal tracks for transmitting data or logic signals on backsides of the integrated circuit. In addition, 2-dimensional backside metal conductive line is disclosed. Accordingly, the greater flexibility for designing the integrated circuit with higher effectiveness of metal routing is provided.

In some embodiments, an integrated circuit structure is disclosed, including a gate, a first conductive line and a pair of second conductive lines, and a first feed-through via. The gate is disposed on a front side of the integrated circuit structure, and extends in a first direction on a first side of a dielectric layer. The first conductive line and a pair of second conductive lines are disposed on a second side, opposite of the first side, of the dielectric layer and on a back side, opposite of the front side, of the integrated circuit structure. The first conductive line is interposed between the pair of second conductive lines in a layout view. The first feed-through via extends through the dielectric layer in a second direction different from the first direction. The first feed-through via couples the gate to the first conductive line. In some embodiments, the first conductive line includes a first portion extending in the first direction and a second portion extending in a third direction different from the first and second directions. The second portion of the first conductive line is coupled to the gate. The integrated circuit structure further includes an active area extending in the third direction on the first side of the dielectric layer; and a contact via coupled between the active area and the first portion of the first conductive line. In some embodiments, the integrated circuit structure further includes a conductive segment extending in the first direction on the first side of the dielectric layer; and a second feed-through via extending through the dielectric layer in the second direction. The second feed-through via couples the conductive segment to the first conductive line. In some embodiments, the pair of second conductive lines are configured to transmit a first supply voltage and a second supply voltage. the conductive segment is configured to transmit a control signal, different from the first and second supply voltages, to the gate. In some embodiments, the integrated circuit structure further includes multiple active areas and multiple contact vias. The active areas extend in a third direction different from the first and second directions on the first side of the dielectric layer. The contact vias are coupled between the active areas and the pair of second conductive lines. The first conductive line is coupled to the contact vias. The first conductive line is in a first layer and the pair of second conductive lines are in a second layer farther from the dielectric layer than the first conductive line. In some embodiments, a distance between the first conductive line and the dielectric layer is in a range of about 10-20 nm. In some embodiments, the first conductive line has a first portion extending in the first direction to couple the contact vias and a second portion extending in the third direction to couple the gate and the first feed-through via. In some embodiments, the integrated circuit structure further includes a pair of active areas, a pair of third conductive lines, a conductive segment, and a second feed-through via. The pair of active areas extend in a third direction different from the first and second directions on the first side of the dielectric layer and overlap the pair of second conductive lines in the layout view. The pair of third conductive lines are separated from the pair of second conductive lines in the third direction and on the second side of the dielectric layer. The conductive segment is on the first side of the dielectric layer. The second feed-through via extend in the second direction to couple one of the pair of third conductive lines to the conductive segment. In some embodiments, the first conductive line extends in the third direction, and the pair of second conductive lines and the pair of third conductive lines extend in the third direction. In some embodiments, the first conductive line and the pair of second conductive lines are in a first layer and a second layer respectively. The integrated circuit structure further includes a third conductive line in a third layer on the second side of the dielectric layer, wherein; and a second feed-through via coupled between the third conductive line and the first conductive line. The first layer is the closest layer, among the first to third layers, to the dielectric layer, and the third layer is the farthest layer, among the first to third layers, to the dielectric layer.

Also disclosed is an integrated circuit structure that includes a first cell, a second cell arranged next to the first cell. The first cell includes a gate on a front side of the integrated circuit structure, and a first feed-through via extending from a backside of the integrated circuit structure to the front side of the integrated circuit structure to be coupled to the gate. The second cell includes a conductive segment on the front side of the integrated circuit structure, at least one first conductive line in a first layer on the backside of the integrated circuit structure, and a second feed-through via which is extends from the backside of the integrated circuit structure to the front side of the integrated circuit structure to be coupled between the first conductive line and the conductive segment. The integrated circuit structure further includes a second conductive line in a second layer on the backside of the integrated circuit structure. The second conductive line includes a first portion extending in a first direction to couple to the first feed-through via and a second portion extending in a second direction different from the first direction to couple to the second feed-through via. In the second layer is closer to the front side of the integrated circuit structure than the first layer. In some embodiments, the first cell further includes a pair of active areas on the front side of the integrated circuit structure, and at least one third conductive line in the first layer on the backside of the integrated circuit structure. The gate crosses the pair of active areas and the at least one third conductive line in a layout view. The integrated circuit structure further includes a cut layer between the first cell and the second cell. In some embodiments, the at least one third conductive line comprises a pair of third conductive lines. The integrated circuit structure further includes a pair of contact vias coupled between the pair of active areas and the pair of third conductive lines. The pair of third conductive lines are configured to transmit supply voltages for the first cell. In some embodiments, the at least one first conductive line includes multiple first conductive lines, and the at least one third line includes multiple third conductive line. The gate, the first conductive lines, and the third conductive lines extend in a first direction, and the second conductive line extends in a second direction different from the first direction. In some embodiments, the at least one first conductive line extend in the first direction.

Also disclosed is a method including the following operations: forming a sacrifice layer on a first side of an integrated circuit structure, in which an active semiconductor device on a second side, opposite of the first side, of the integrated circuit structure; forming a first dielectric layer surrounding the sacrifice layer; forming a second dielectric layer on the first dielectric layer, in which the second dielectric layer has a thickness smaller than a height of the sacrifice layer; forming a first feed-through via extending from the first side to the second side of the integrated circuit structure to be coupled to a conductive segment of the active semiconductor device; forming a first conductive line on the second dielectric layer; increasing the thickness of the second dielectric layer from a first thickness to a second thickness; and forming a second conductive line on the second dielectric layer. In some embodiments, forming the first conductive line on the second dielectric layer includes removing a portion of the first dielectric layer on a side of the sacrifice layer; and forming a portion of the first conductive line contacting the side of the sacrifice layer. In some embodiments, the method further includes forming an isolating layer on the sacrifice layer; removing the isolating layer and the sacrifice layer after forming the first conductive line; and forming a contact via between the first dielectric layer. In some embodiments, the method further includes removing a portion of the first dielectric layer on a side of the sacrifice layer before removing the isolating layer and the sacrifice layer. The contact via has a first surface coupled to an active region of the active semiconductor device, a second surface coupled to the second conductive line, and a third surface coupled to the first conductive line. In some embodiments, the method further includes forming a second feed-through via extending from the first side to the second side of the integrated circuit structure to be coupled to a gate structure of the active semiconductor device and a third conductive line on the second dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit structure, comprising:
 a first cell, comprising:
  a gate on a front side of the integrated circuit structure; and
  a first feed-through via extending from a backside of the integrated circuit structure to the front side of the integrated circuit structure to be coupled to the gate;
 a second cell arranged next to the first cell, comprising:
  a conductive segment on the front side of the integrated circuit structure;
  at least one first conductive line in a first layer on the backside of the integrated circuit structure; and
  a second feed-through via which extends from the backside of the integrated circuit structure to the front side of the integrated circuit structure to be coupled between the first conductive line and the conductive segment; and
 a second conductive line on the backside of the integrated circuit structure, wherein the second conductive line comprises a first portion extending in a first direction to couple to the first feed-through via and a second portion extending in a second direction different from the first direction to couple to the second feed-through via,
wherein the second conductive line is closer to the front side of the integrated circuit structure than the at least one first conductive line.

2. The integrated circuit structure of claim 1, wherein the first cell further comprises:
a pair of active areas on the front side of the integrated circuit structure; and
at least one third conductive line in the first layer on the backside of the integrated circuit structure, wherein the gate crosses the pair of active areas and the at least one third conductive line in a layout view;
wherein the integrated circuit structure further comprises:
a cut layer between the first cell and the second cell.

3. The integrated circuit structure of claim 2, wherein the at least one third conductive line comprises a pair of third conductive lines,
wherein the integrated circuit structure further comprises:
a pair of contact vias coupled between the pair of active areas and the pair of third conductive lines;
wherein the pair of third conductive lines are configured to transmit supply voltages for the first cell.

4. The integrated circuit structure of claim 2, wherein the at least one first conductive line comprises a plurality of first conductive lines, and
the at least one third conductive line comprises a plurality of third conductive lines;
wherein the gate, the plurality of first conductive lines, and the plurality of third conductive lines extend in the first direction.

5. The integrated circuit structure of claim 1, wherein the at least one first conductive line extend in the first direction.

6. An integrated circuit structure, comprising:
a first cell, comprising:
a gate on a front side of the integrated circuit structure; and
a first feed-through via extending from a backside of the integrated circuit structure to the front side of the integrated circuit structure to be coupled to the gate;
a second cell arranged next to the first cell, comprising:
a conductive segment in a first layer on the front side of the integrated circuit structure;
a first conductive line in a second layer on the backside of the integrated circuit structure; and
a second feed-through via which extends through the first and second layers to be coupled between the first conductive line and the conductive segment; and
a second conductive line on the backside of the integrated circuit structure, wherein the second conductive line comprises a first portion extending in a first direction to couple to the first feed-through via and a second portion extending in a second direction different from the first direction to couple to the second feed-through via,
wherein the second conductive line is closer to the front side of the integrated circuit structure than the first conductive line.

7. The integrated circuit structure of claim 6, further comprising:
a third feed-through via extending parallel to the second feed-through via and coupled to the second feed-through via through the second portion of the second conductive line.

8. The integrated circuit structure of claim 7, further comprising:
a third conductive line on the backside of the integrated circuit structure extending parallel to the first conductive line and coupled to the conductive segment through the third feed-through via.

9. The integrated circuit structure of claim 8, wherein the second portion of the second conductive line is surrounded by the second layer, and
the conductive segment is surrounded by the first layer.

10. The integrated circuit structure of claim 6, further comprising:
a conductive track on the front side; and
a conductive via coupled between the conductive track and the conductive segment,
wherein a height of the conductive via is smaller than the height of the first feed-through via.

11. The integrated circuit structure of claim 10, wherein the height of the first feed-through via is smaller than the height of the second feed-through via.

12. The integrated circuit structure of claim 6, wherein a distance between the conductive segment and the first conductive line is greater than a distance between the conductive segment and the second conductive line.

13. An integrated circuit structure, comprising:
a first cell, comprising:
a first gate on a front side of the integrated circuit structure; and
a first feed-through via extending from a backside of the integrated circuit structure to the front side of the integrated circuit structure to be coupled to the first gate;
a second cell arranged separated from the first cell in a first direction, comprising:
a first conductive segment on the front side of the integrated circuit structure;
a first conductive line on the backside of the integrated circuit structure; and
a second feed-through via extending from the backside of the integrated circuit structure to the front side of the integrated circuit structure to be coupled between the first conductive line and the first conductive segment; and
a second conductive line on the backside of the integrated circuit structure, wherein the second conductive line comprises a first portion extending in the first direction to couple to the first feed-through via and a second portion extending in a second direction different from the first direction to couple the second feed-through via,
wherein the second conductive line is closer to the front side of the integrated circuit structure than the first conductive line.

14. The integrated circuit structure of claim 13, further comprising:
a third feed-through via extending from the backside of the integrated circuit structure to the front side of the integrated circuit structure to be coupled to the second portion of the second conductive line;
a conductive track arranged on the front side; and
a conductive via coupled between the conductive track and the second conductive line.

15. The integrated circuit structure of claim 14, wherein the second cell further comprises:
a pair of active areas, on the front side of the integrated circuit structure, that extend in the first direction and are separated from each other in the second direction,
wherein the conductive via is interposed between the pair of active areas.

16. The integrated circuit structure of claim 13, wherein a height of the first feed-through via is smaller than a height of the second feed-through via.

17. The integrated circuit structure of claim 13, further comprising:
   a dielectric layer interposed between the front side and the backside,
   wherein the second conductive line is closer to the dielectric layer than the first conductive line.

18. The integrated circuit structure of claim 13, wherein the second portion of the second conductive line is interposed between second and third gates that are separated from each other in the first direction.

19. The integrated circuit structure of claim 13, wherein the first cell further comprises a first pair of active areas on the front side, and the second cell further comprises a second pair of active areas on the front side,
   wherein the first portion of the second conductive line extend in the first direction and is interposed between the first and second pairs of active areas.

20. The integrated circuit structure of claim 13, wherein the first cell further comprises:
   a second conductive segment extending in the second direction, wherein the first portion of the second conductive line passes through the second conductive segment in a layout view.

* * * * *